(12) United States Patent
Chang et al.

(10) Patent No.: US 12,484,240 B2
(45) Date of Patent: Nov. 25, 2025

(54) SEMICONDUCTOR DEVICE AND METHODS OF FORMING THE SAME

(71) Applicant: Taiwan Semiconductor Manufacturing Co., Ltd., Hsinchu (TW)

(72) Inventors: Tien-Shun Chang, New Taipei (TW); Kuo-Ju Chen, Taichung (TW); Su-Hao Liu, Jhongpu Township (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 767 days.

(21) Appl. No.: 17/676,637

(22) Filed: Feb. 21, 2022

(65) Prior Publication Data
US 2023/0268423 A1    Aug. 24, 2023

(51) Int. Cl.
| | |
|---|---|
| *H10D 62/822* | (2025.01) |
| *H10D 30/01* | (2025.01) |
| *H10D 30/62* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 30/024* (2025.01); *H10D 30/6211* (2025.01); *H10D 62/115* (2025.01); *H10D 64/017* (2025.01); *H10D 84/013* (2025.01); *H10D 84/0151* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS 10,163,912 B2    12/2018    Lin et al.

FOREIGN PATENT DOCUMENTS

| | | |
|---|---|---|
| CN | 105226021 A | 1/2016 |
| TW | 201737339 A | 10/2017 |

*Primary Examiner* — Steven B Gauthier
*Assistant Examiner* — Lamont B Koo
(74) *Attorney, Agent, or Firm* — Slater Matsil, LLP

(57) ABSTRACT

A method of forming a semiconductor device includes forming a first dummy gate structure over a first region of a substrate and a second dummy gate structure over a second region of the substrate, the first region and the second region of the substrate having a first composition, the first composition having a first etch rate; implanting the first region of the substrate with dopants laterally adjacent to the first dummy gate structure, wherein after the implanting the first region, the first region has a second composition having a second etch rate, the second etch rate being different from the first etch rate; etching a first recess in the first region of the substrate having the second composition and a second recess in the second region having the first composition; and epitaxially growing a first source/drain region in the first recess and a second source/drain region in the second recess.

20 Claims, 26 Drawing Sheets

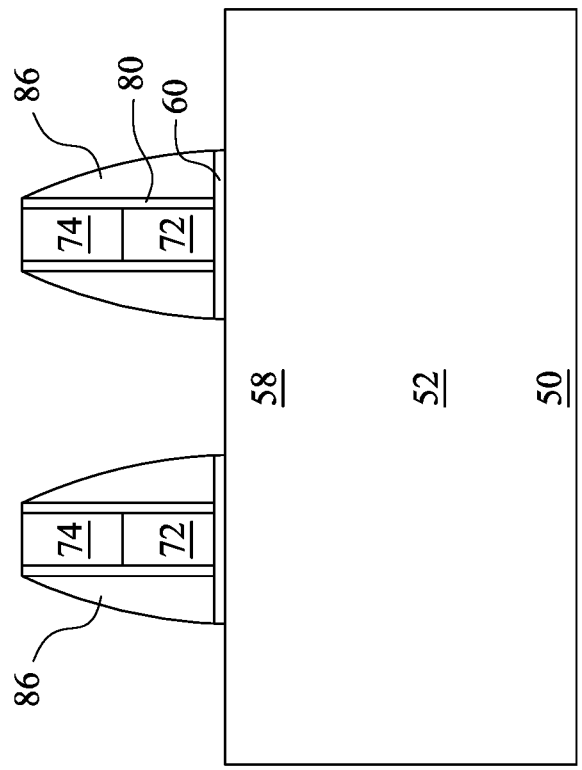
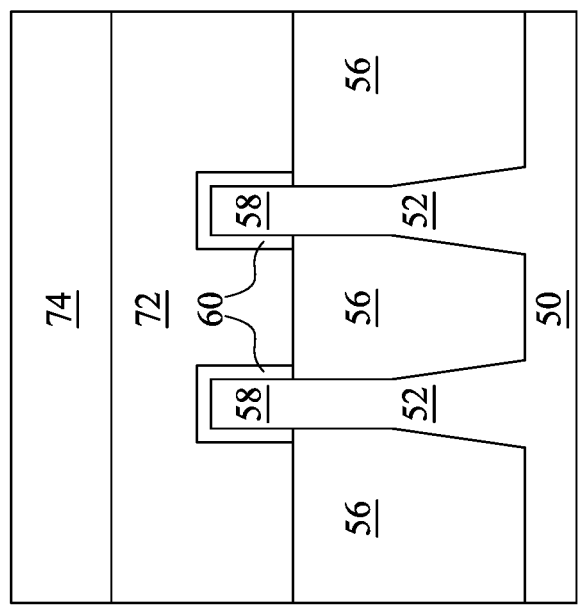
Fig. 9B
Fig. 9A

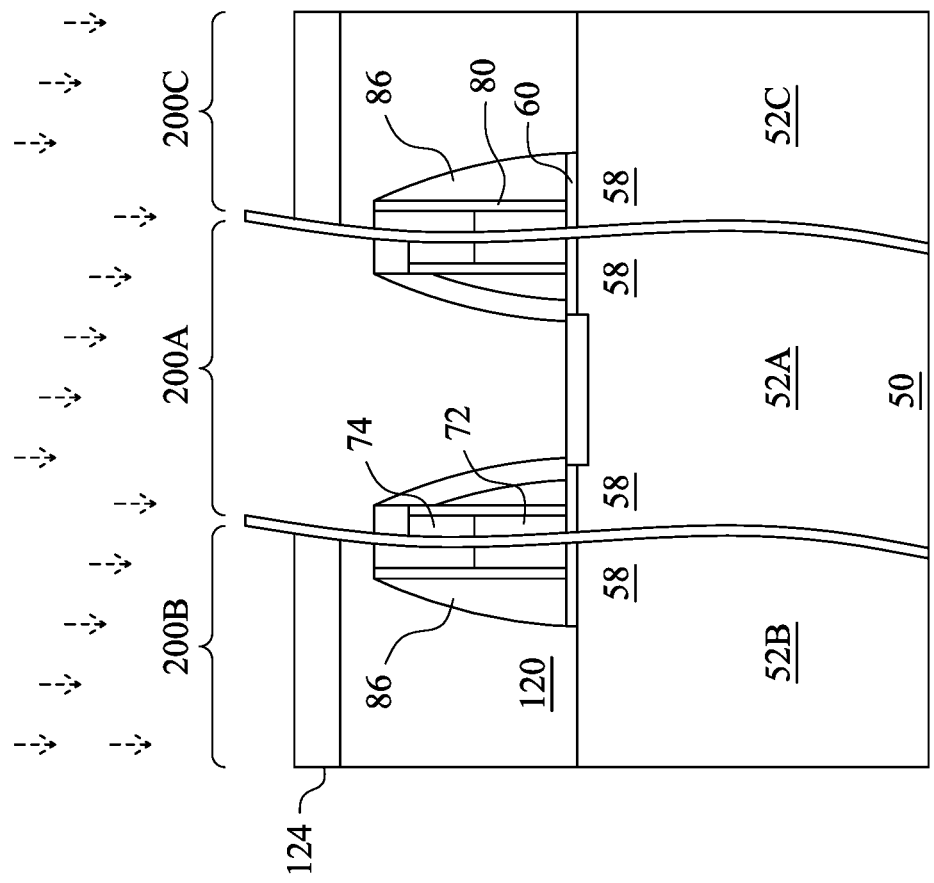
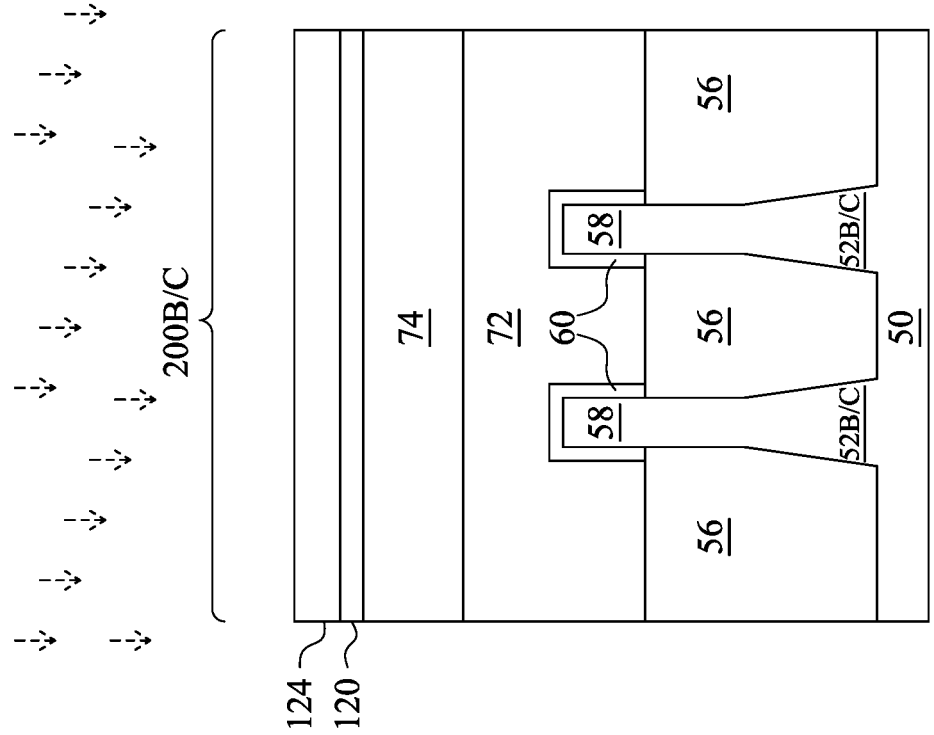
Fig. 11A
Fig. 11B

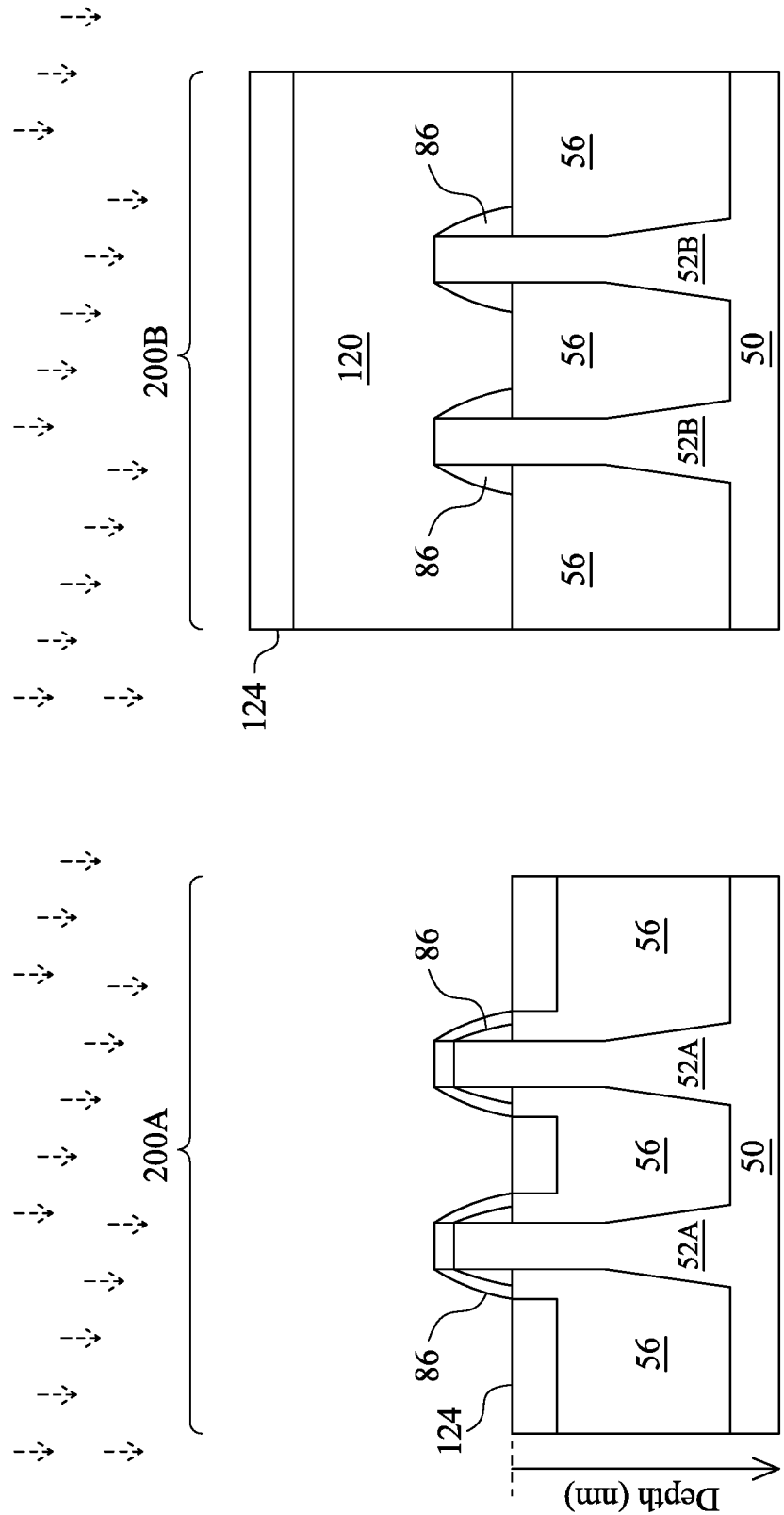

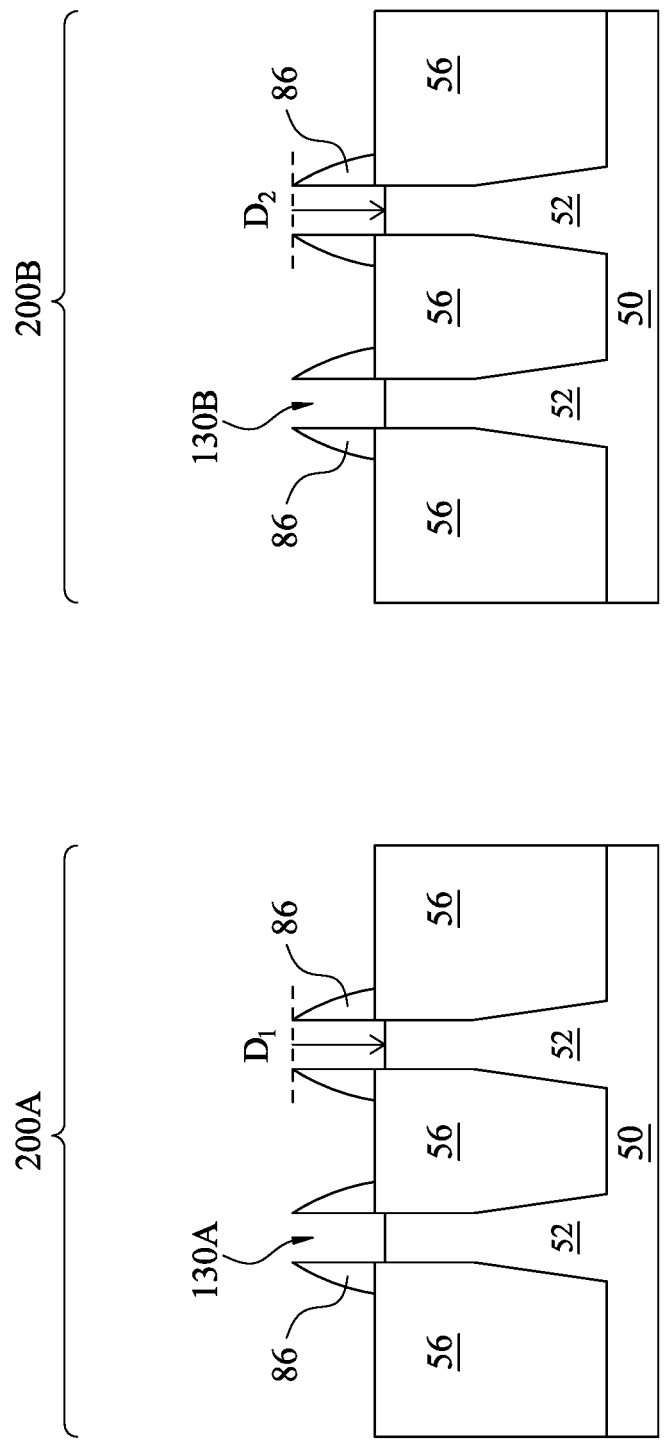

SEMICONDUCTOR DEVICE AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 11C, 11D, 11E, 11F, 12A, 12B, 12C, 12D, 13A, 13B, 13C, 13D, 14A, 14B, 15A, 15B, 16A, 16B, 17A, 17B, 17C, 18A, 18B, 19A, and 19B are cross-sectional views of intermediate stages in the manufacturing of FinFETs, in accordance with some embodiments.

DETAILED DESCRIPTION

Figure 1:
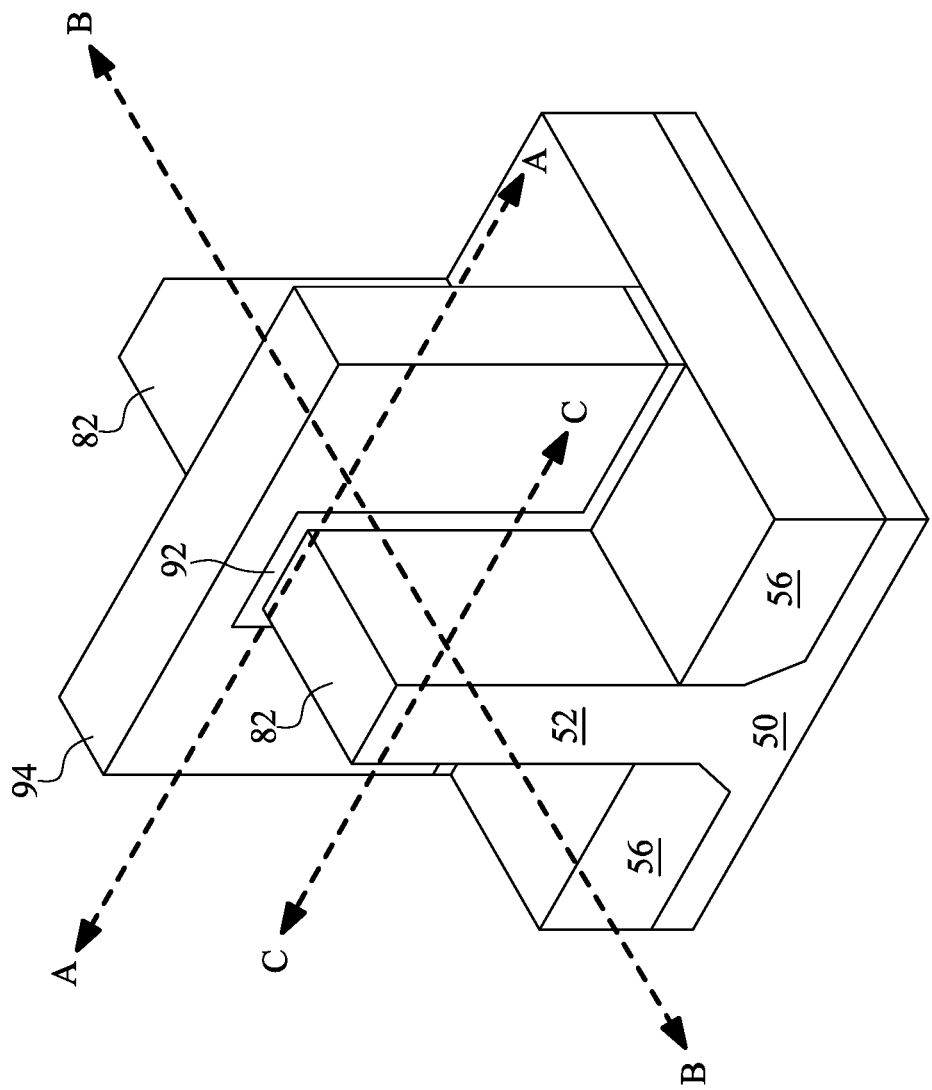
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosed embodiments relate to the fabrication of semiconductor devices. The semiconductor devices may include transistors, such as FinFETs. Formation of the transistors may include forming dummy gate structures, forming source/drain regions on opposing sides of the dummy gate structures, and replacing portions of the dummy gate structures with gate dielectric layers and gate electrodes. In accordance with some embodiments, recesses are etched into portions of the semiconductor substrate on opposing sides of the dummy gate structures, and epitaxial source/drain regions are grown therein. Before the etching process, a first region of the semiconductor substrate (e.g., comprising a plurality of dummy gate structures) is implanted with dopants while a second region (e.g., also comprising a plurality of dummy gate structures) is masked. After the implantation process, the mask is removed in order to etch recesses in the semiconductor substrate in both the first and second regions. Implantation of the dopants modifies the composition and, therefore, various material properties of the semiconductor substrate in the first region. As a result, the doped semiconductor substrate in the first region is converted to a doped material having a different etch rate (e.g., a faster etch rate) as compared to the material of the undoped semiconductor substrate in the second region. However, due to differences in one or more characteristics between the first region and the second region (e.g., a small pitch and a large pitch, respectively), the semiconductor substrate may be etched at similar rates (or to similar depths) in both the first region and the second region. In addition, epitaxial source/drain regions grown in the first and the second regions may have similar depths, shapes, and dimensions. Further, the source/drain regions throughout the first and second regions may have greater consistency, thereby improving yield, performance, and reliability of the completed semiconductor devices.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In some embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 19B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, and 19A are illustrated along reference cross-section A-A illustrated in FIG. 1, and FIGS. 8B, 9B, 10B, 11B, 12B, 13B, 14B, 15B, 16B, 17B, 17C, 18B, and 19B are illustrated along a similar cross-section B-B illustrated in FIG. 1, except for multiple fins/FinFETs. FIGS. 10C, 10D, 11C, 11D, 12C, 12D, 13C, and 13D are illustrated along reference cross-section C-C illustrated in FIG. 1, except for multiple fins/FinFETs.

Figure 2:
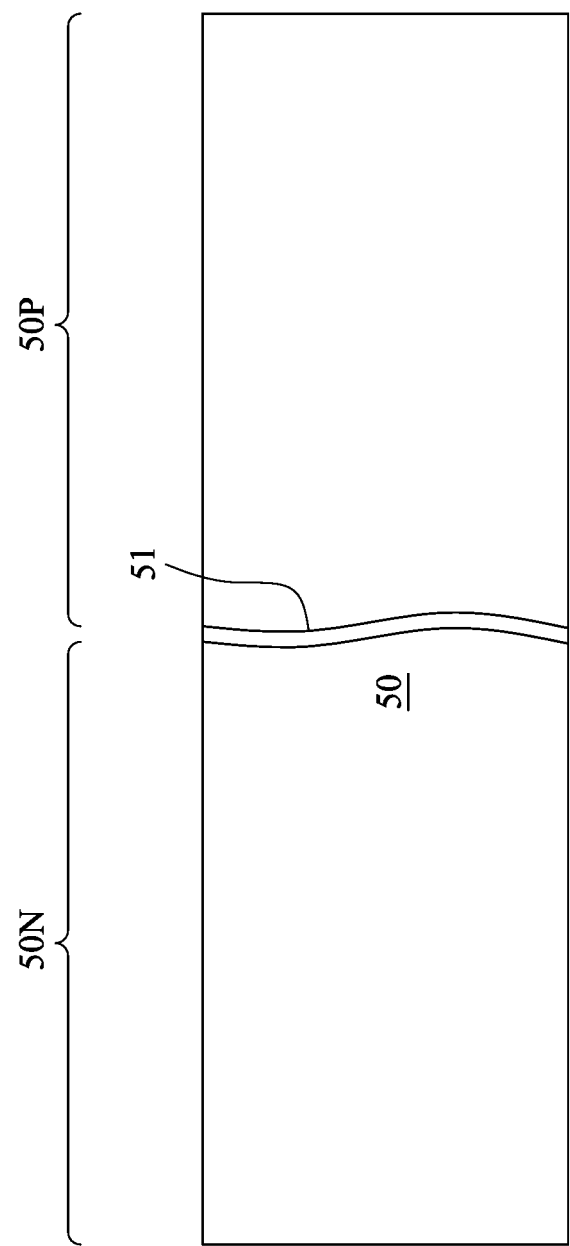

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
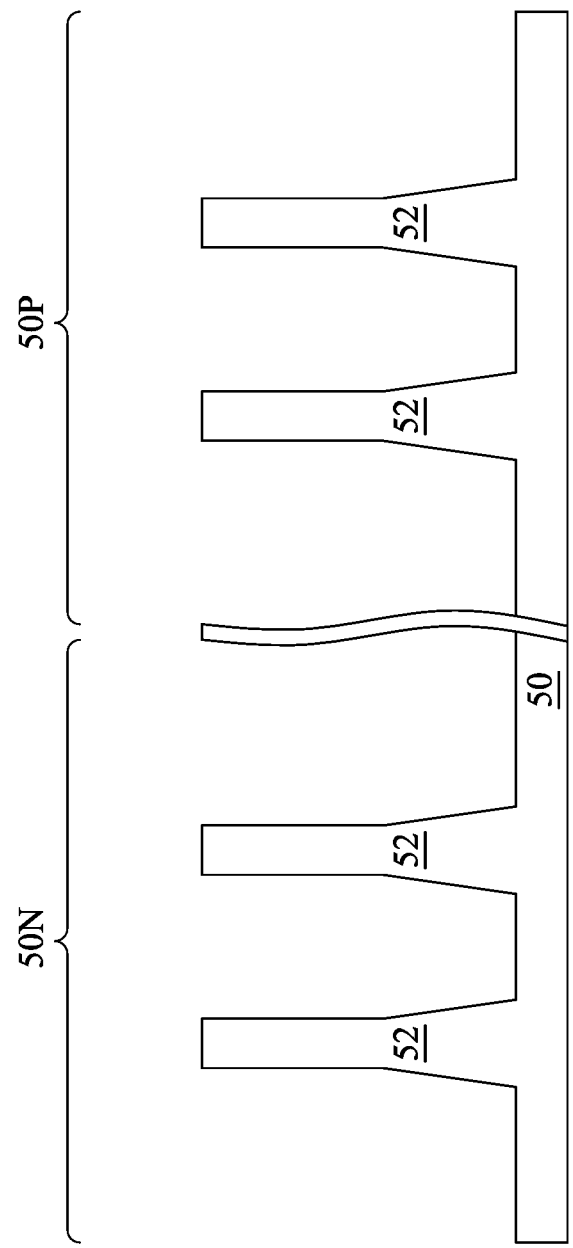

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
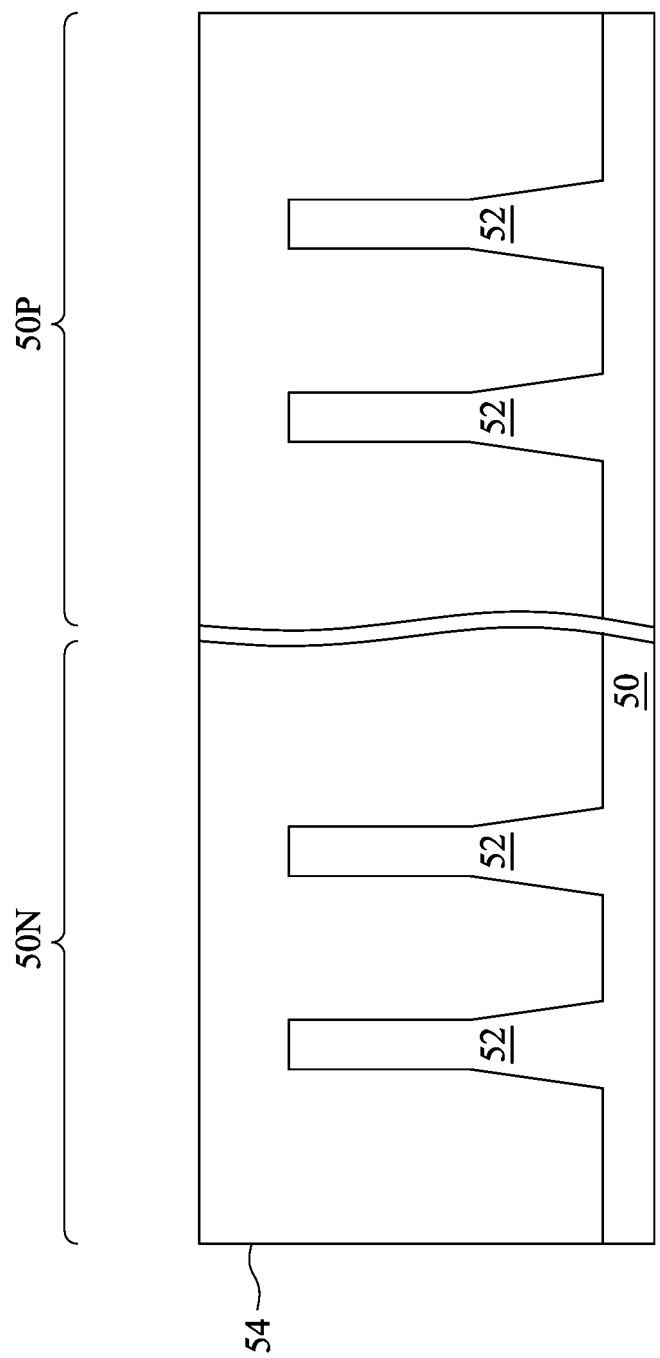

In FIG. 4, an insulation material 54 is formed over the substrate 50 and between neighboring fins 52. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide including a dopant material (e.g., nitrogen). For example, a silicon oxide (e.g., a silicon oxynitride) or a silicon nitride may be formed by a FCVD process. An anneal process (e.g., in an oxygen environment) may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
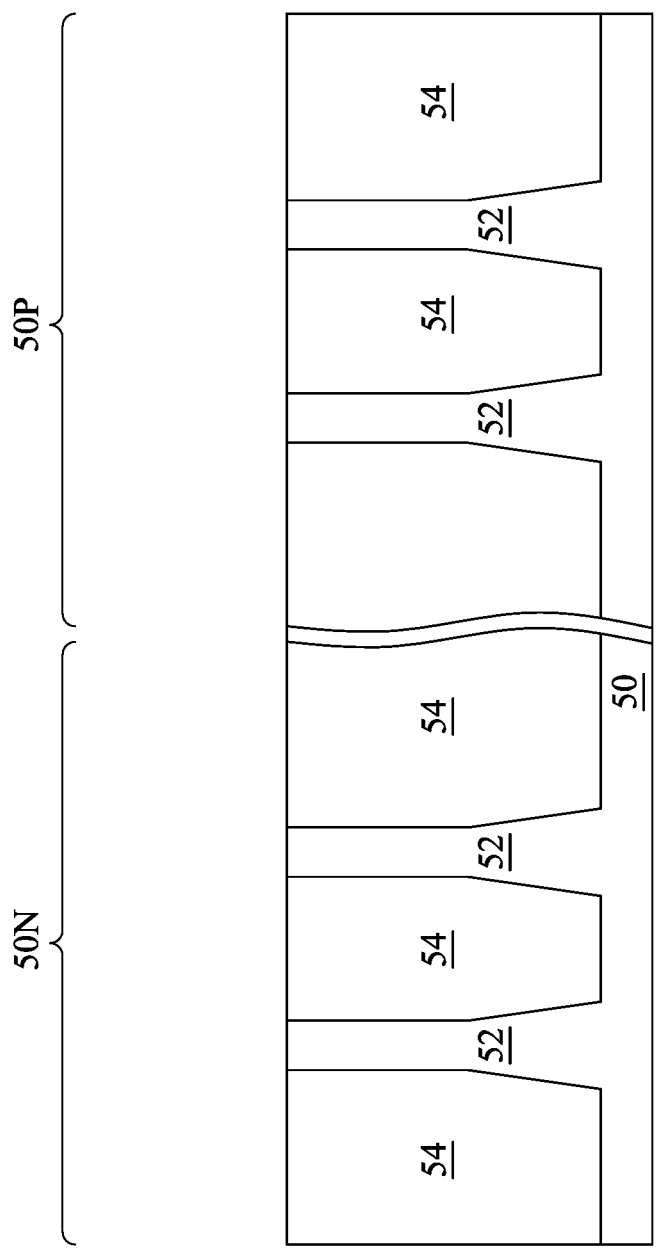

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
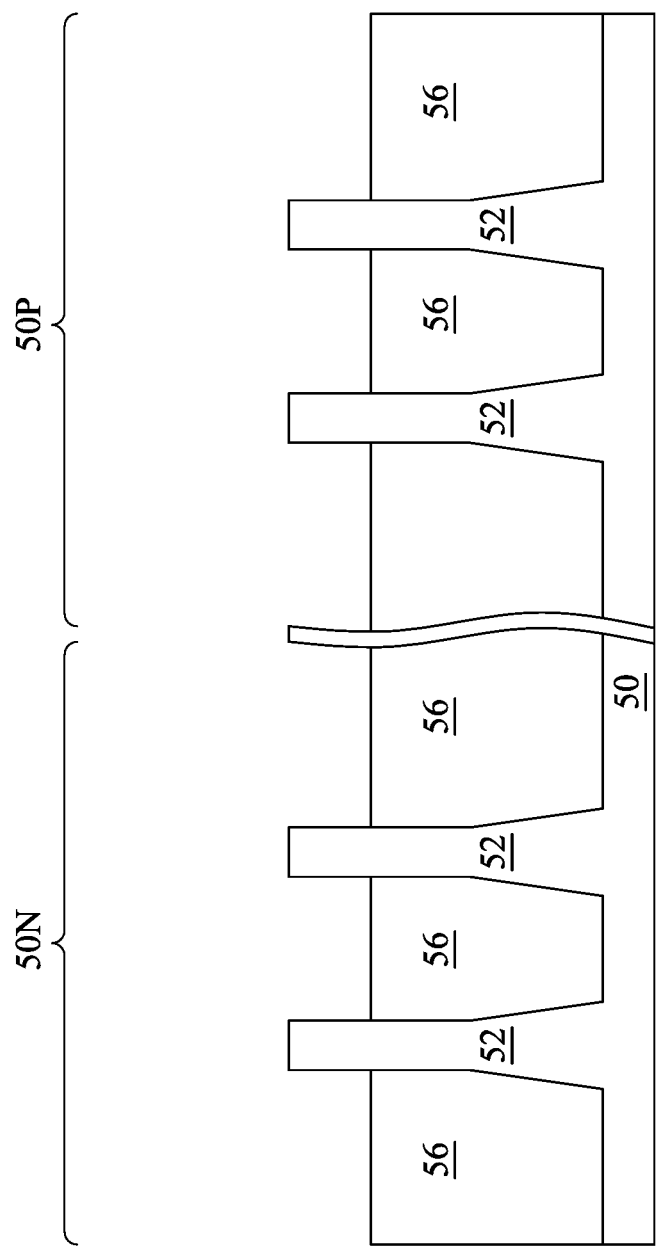

In FIG. 6, the insulation material 54 is recessed to form Shallow Trench Isolation (STI) regions 56. The insulation material 54 is recessed such that upper portions of the fins 52 in the n-type region 50N and in the p-type region 50P protrude from between neighboring STI regions 56. Further, top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth (e.g., with n-type or p-type impurities), which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of n-type impurities in the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
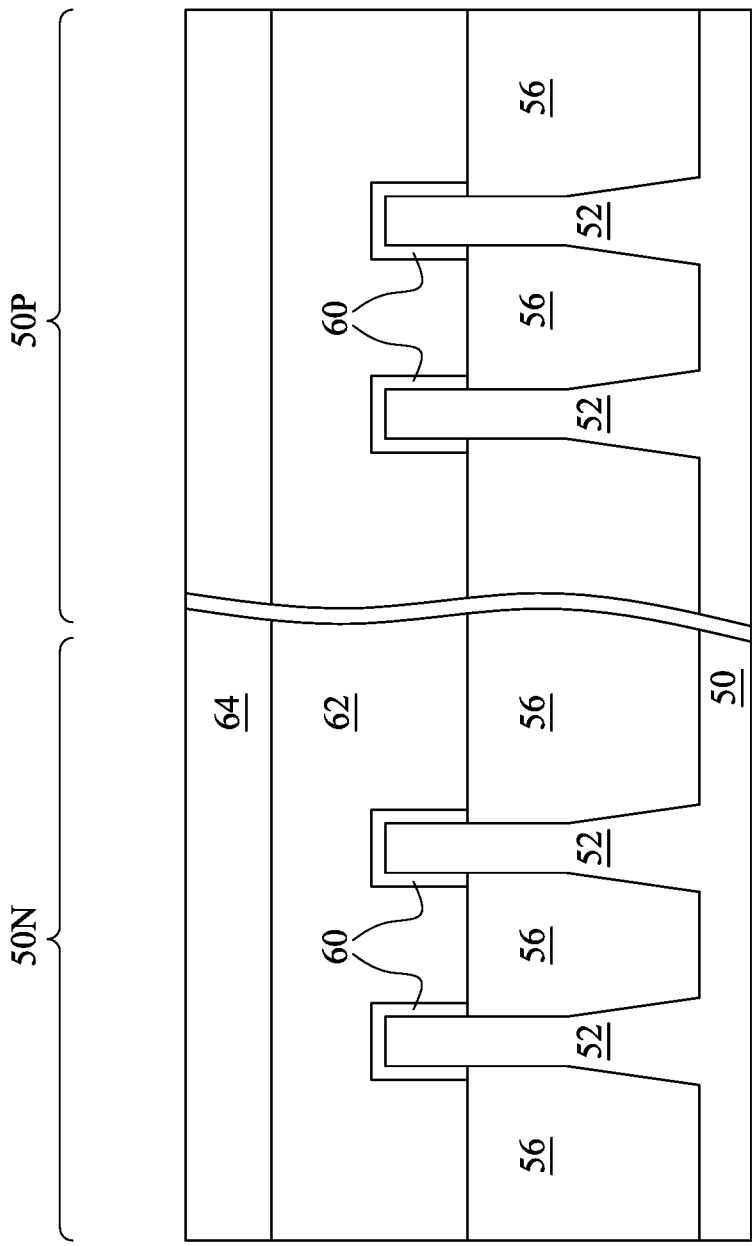

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 19B illustrate various additional steps in the manufacturing of embodiment devices. FIGS. 8A through 19B illustrate features in either of the n-type region 50N and the p-type region 50P. For example, the structures illustrated in FIGS. 8A through 19B may be applicable to both the n-type region 50N and the p-type region 50P. Differences (if any) in the structures of the n-type region 50N and the p-type region 50P may be described in the text accompanying each figure.

Figure 8A:
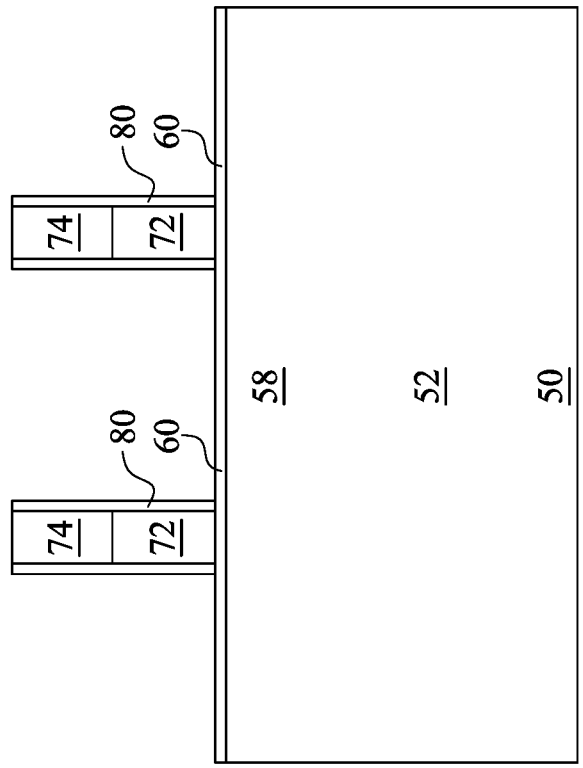
Figure 8B:
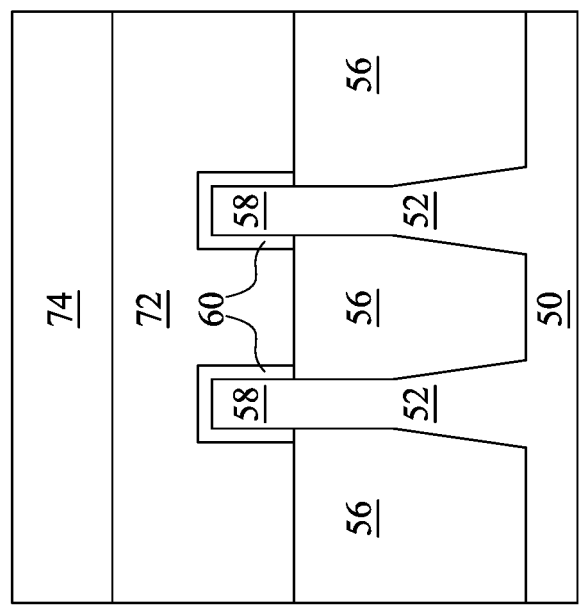

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. In accordance with some embodiments, the anisotropic etching may further remove portions of the dummy dielectric layer 60 disposed over the fins 52 and laterally adjacent to the gate spacers 86. In some embodiments (not illustrated), these portions of the dummy dielectric layer 60 may be removed in subsequent etching processes. The dummy gate 72, the mask 74, the dummy dielectric layer 60, the gate seal spacers 80, and the gate spacers 86 may be collectively referred to as a "dummy gate structure."

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

FIGS. 10A through 13D illustrate various steps in the formation of epitaxial source/drain regions 82 of embodiment devices. In particular, a first implantation mask 120 is formed over the structure (see FIGS. 10A through 10D), the fins 52 of a first region 200A of the structure are implanted with dopants to modify their material properties while the fins 52 of other regions of the structure are masked (see FIGS. 11A through 11F), source/drain recesses 130 are etched into the fins 52 of the first region 200A and the other regions (see FIGS. 12A through 12D), and epitaxial source/drain regions 82 are formed in the source/drain recesses 130 (see FIGS. 13A through 13D). Note that the implantation process performed in the first region 200A may include a portion of the p-type region 50P, a portion of the n-type region 50N, or portions of both. Further, the regions 200A/B/C may each include a single continuous region of the substrate 50 or a plurality of discrete (e.g., non-continuous) regions.

In FIGS. 10A through 10D, a first implantation mask 120 is formed over the structure and patterned to expose the first region 200A, while covering a second region 200B and a third region 200C. The first implantation mask 120 may include a photoresist and/or other masks (not separately illustrated) and be formed similarly as described above in connection with other processes. For example, the photoresist of the first implantation mask 120 may be formed by using a spin-on technique and can be patterned using acceptable photolithography techniques.

Figure 10B:
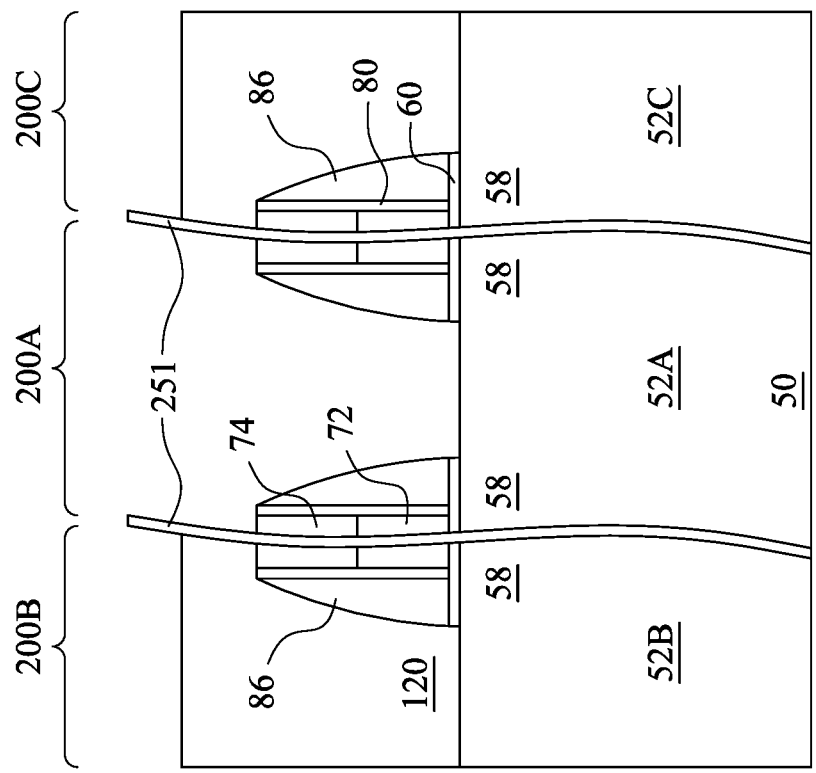

Referring specifically to FIG. 10B, dividers 251 are provided to separately illustrate the first region 200A, the second region 200B, and the third region 200C. Note that the dummy gate structures (e.g., each including the dummy gate 72, the mask 74, the dummy dielectric layer 60, the gate seal spacers 80, and the gate spacers 86) partially illustrated within the first region 200A may not be the same dummy gate structures partially illustrated within the second region 200B and the third region 200C. In addition, each of the regions 200A/B/C may be physically separated from the one or both of the other regions, and any number of dummy gate structures or other device features (e.g., other active devices, doped regions, isolation structures, etc.) may be disposed within or between the regions 200A/B/C. Similarly, in FIG. 10A, the dummy gate structure is illustrated as being within the second or third region 200B/C solely in a representative capacity.

For illustrative purposes, the first region 200A and the third region 200C illustrate regions having a relatively high density with a small pitch between adjacent features (e.g., dummy gates 72), and the second region 200B illustrates a region having a relatively low density with a large pitch between adjacent features (e.g., dummy gates 72). While the material of the first fin 52A, the second fin 52B, and the third fin 52C may be the same, the first fin 52A in the first region 200A and the third fin 52C in the third region 52C may etch at a slower rate than the second fin 52B in the second region 200B due to the higher pattern density in the first region 200A and the third region 200C restricting exposure of the etchants to the first fin 52A and the third fin 52C. For example, the first region 200A may have a small pitch, the second region 200B may have a large pitch, and the third region 200C may have a small pitch that is similar to the small pitch in the first region 200A. For example, each of the pitches may range from greater than 0 nm to 60 nm.

As will be discussed in greater detail below, the first fin 52A in the first region 200A will be implanted with dopants to increase an etch rate of the first fin 52A as compared to the etch rate of the second fin 52B. By increasing the etch rate of the material of the first fin 52A in the first region 200A as compared with the etch rate of the material of the second fin 52B in the second region, a depth of the recesses etched in the first fin 52A and the second fin 52 may be controlled to have similar depths. The third fin 52C in the third region 200C, which may have a similar high density/small pitch as the first region 200A, is not implanted. As a result, the third fin 52C will be etched at a lower rate as compared to the first fin 52A, thereby resulting in a recess having a smaller depth as compared to a depth of the recess in the first fin 52A. As such, by selectively controlling the areas of implant the depths of the recesses may be controlled, thereby allowing greater control over the operating characteristics of the individual transistors.

Figure 10A:
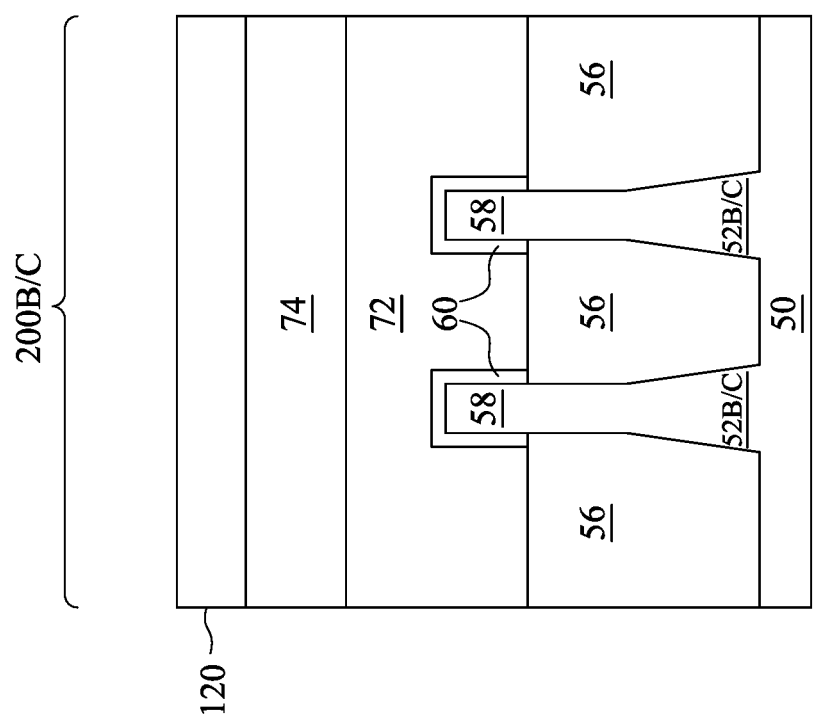
Figure 10D:
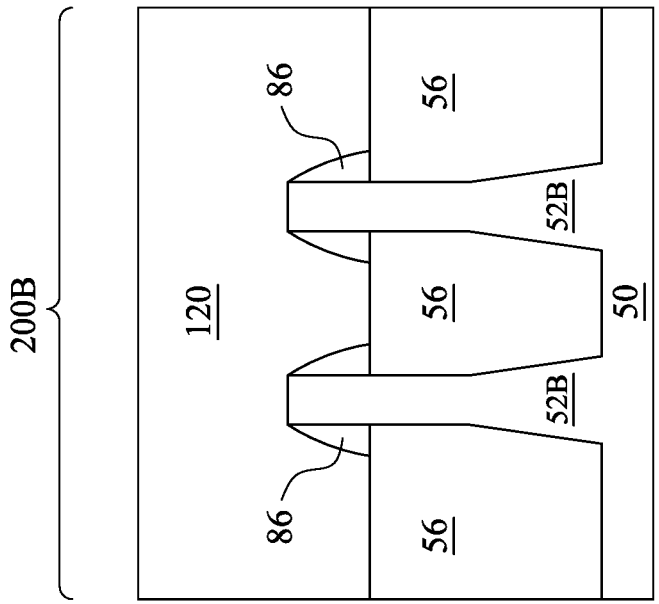
Figure 10C:
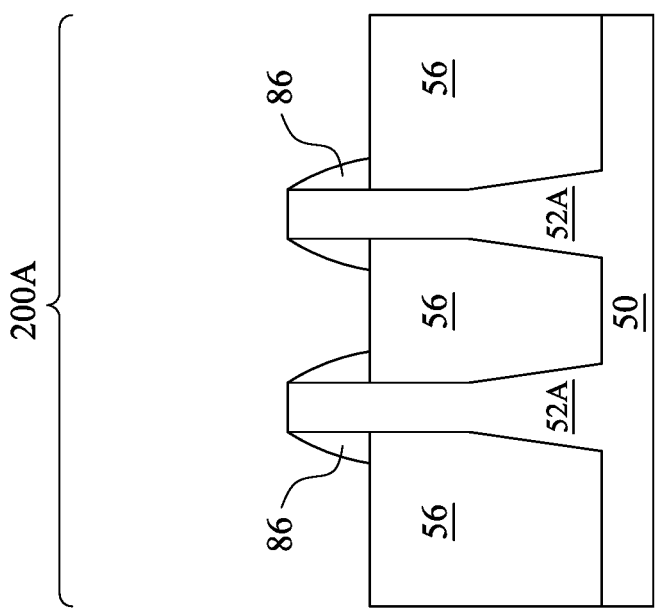

FIG. 10C illustrates a cross-section of the first fins 52A and the STI regions 56 located within the first region 200A, and FIG. 10D illustrates a cross-section of the second fins 52B and the STI regions 56 located within the second region 200B. As illustrated, the first implantation mask 120 is formed over the second fins 52B within the second region 200B (and over the third fins 52C in the third region 200C), while the first fins 52A in the first region 200A remain exposed.

In FIGS. 11A through 11F, an implantation layer 124 is formed over the structure by performing an implantation process to implant dopants into the first fins 52A of the first region 200A while the second and third fins 52B/C of the second and third regions 200B/C are covered by the first implantation mask 120. In some embodiments, exposed upper portions of the first fins 52A are converted to the implantation layer 124 by the dopants of the implantation process. Note that the fins 52 may be described herein as "doped" or "undoped" with respect to the dopants from the implantation process (e.g., FIGS. 11A through 11F), and notwithstanding any other types of doping such as n-type or p-type impurities described above and below (see, e.g., FIGS. 6, 8A, and 8B).

As a result of the implantation process, upper portions of the first fins 52A (e.g., including the implantation layer 124) will have modified material properties (e.g., a modified concentration profile) as compared with the material properties of the second and the third fins 52B/C of the second and third regions 200B/C (see, e.g., FIGS. 12A through 12D). For example, the implantation layer 124 may extend into the first fins 52A to a depth (e.g., a thickness of the implantation layer 124) ranging from greater than 0 nm to 60 nm. In accordance with some embodiments, a portion of the implantation layer 124 may additionally form over outer surfaces (e.g., upper and/or side surfaces) of the first fins 52A, as illustrated in FIG. 11E.

In accordance with some embodiments, the implantation process may be an ion implantation process that implants ion dopants into the first fins 52A of the first region 200A, although any suitable process may be used. The dopants may include nitrogen, argon, silicon, germanium, the like, or a combination thereof. For example, although not specifically illustrated, one or more of precursors such as nitrogen gas, ammonia, argon gas, silane, germane, or a combination thereof may be delivered to a plasma generator from a supply, such as a storage tank or a facility that independently prepares and delivers the material. In some embodiments, the dopants are different from the n-type and p-type impurities used to form the LDD regions as discussed above. In some embodiments, the dopants may include a same material as used in the STI regions 56 such as silicon or a dopant material (e.g., nitrogen). The implantation process may be performed at temperatures ranging from −150° C. to 450° C. and at pressures ranging from $10^{-6}$ Torr to $2\times10^{-5}$ Torr. In some embodiments, the implantation process is followed by an anneal process, such as at temperatures ranging from 400° C. to 1200° C., to repair excess damage in the first fins 52A and/or other features receiving the dopants.

The dopants may be accelerated to the structure (e.g., located within a processing chamber) with an energy ranging from 1 kEv to 30 kEv and at a dosage concentration ranging from $10^{14}$ atoms/cm$^3$ to $10^{16}$ atoms/cm$^3$. Utilizing an energy and a dosage concentration of at least 1 kEv and/or $10^{14}$ atoms/cm$^3$, respectively, allows the dopants to penetrate sufficiently deep and at a high enough concentration into the first fins 52A to sufficiently modify the composition and material properties. Utilizing an energy and a dosage concentration of no more than 30 kEv and/or $10^{16}$ atoms/cm$^3$, respectively, ensures that the dopants penetrate to a shallow enough depth or at a low enough concentration into the first fins 52A to prevent or minimize any damage to other nearby features (e.g., the dummy gate structures, the STI regions 56, and the substrate 50) while sufficiently modifying the composition and material properties of the first fins 52A.

As illustrated, in addition to the dopants being implanted into the first fins 52A of the exposed first region 200A to form the implantation layer 124, the implantation layer 124 may further form in upper portions of other exposed features of the structure, such as the exposed STI regions 56, the dummy gate structures (e.g., the masks 74, the gate seal spacers 80, and the gate spacers 86), and the first implantation mask 120. The implantation layer 124 may form to varying thicknesses (e.g., depths) in the masks 74 and the STI regions 56 as compared to the first fins 52A discussed above due to differences in material properties, such as densities of the features. For example, the implantation layer 124 in the STI regions 56 (e.g., having a lower density than the fins 52) may reach a thickness (e.g., a depth) of up to 80 nm or an entire depth into the STI regions 56. In addition, the implantation layer 124 in the masks 74 may have a thickness (e.g., depth) into the masks 74 ranging from greater than 0 nm to 200 nm.

Although the implantation layer 124 is illustrated as being formed in the upper portions of the exposed features (e.g., the first fins 52A, the masks 74, the gate seal spacers 80, the gate spacers 86, and the first implantation mask 120), varying amounts of the dopants may penetrate further through those features. As discussed above, the dopants may extend further through materials with lower densities, such as dielectric materials, as compared with materials with higher densities, such as semiconductor and/or metal materials. For example, the implantation layer 124 may extend an entirety through the STI regions 56 and, in some embodiments, partially into underlying portions of the substrate 50.

Figure 11F:
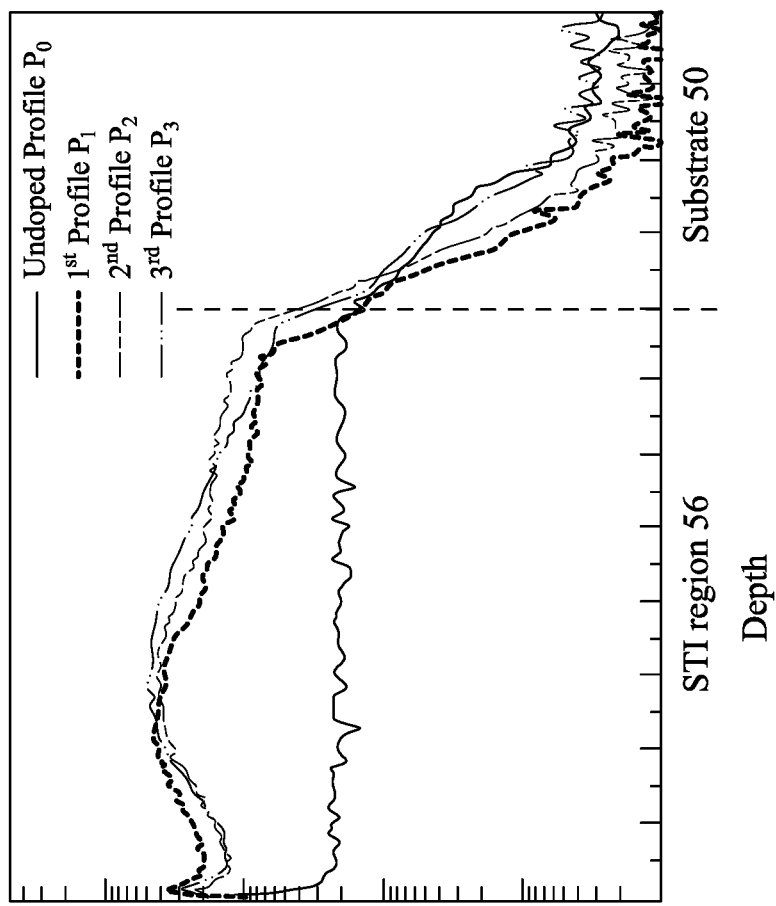
Figure 11E:
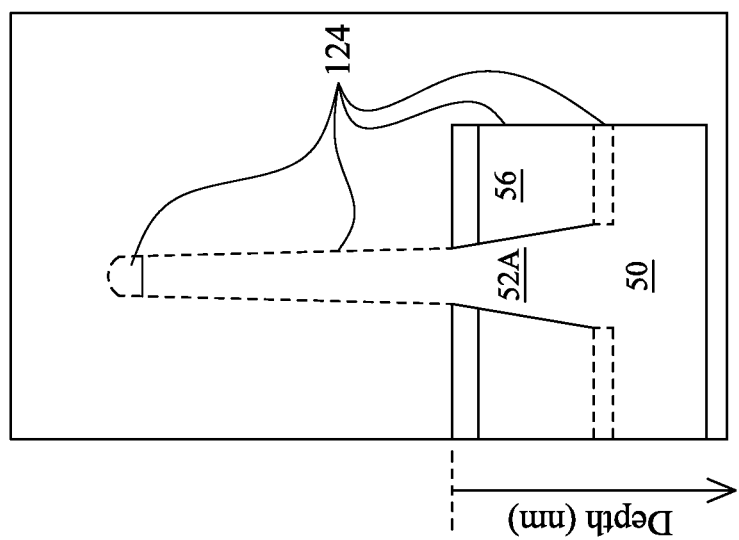
Figures 12A, 12B:
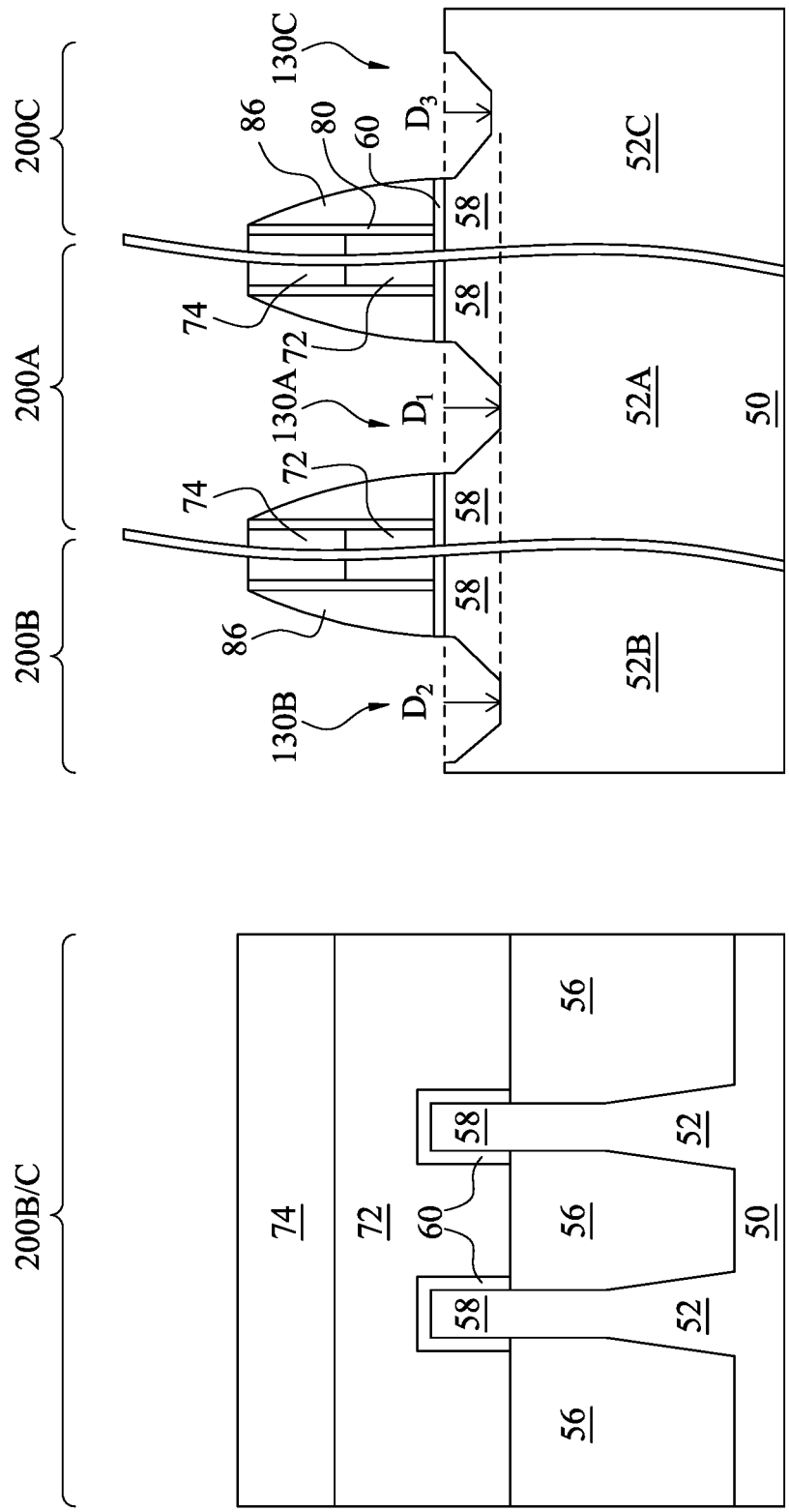

FIG. 11E illustrates a cross-sectional view across one of the first fins 52A in the first region 200A following the implantation process, similar to the cross-sectional view in FIG. 11C. And FIG. 11F provides dopant concentration profiles of corresponding to a depth through the STI region 56 and into the substrate 50. Note that the illustrated embodiment shows that the implantation layer 124 formed through an entirety of the STI region 56 and partially into the underlying portion of the fin 52.

FIG. 11F provides three exemplary dopant concentration profiles (e.g., a first profile $P_1$, a second profile $P_2$, and a third profile $P_3$) of the STI regions 56 in the first region 200A after the implantation process in comparison with an exemplary undoped concentration profile (e.g., an undoped profile $P_0$) of the STI regions 56 in the second and third regions 200B/C having not received the dopants from the implantation process. The exemplary dopant concentration profiles represent dopant concentrations from a top surface of the STI regions 56 to a depth entirely through the STI regions 56 and extending partially into the substrate 50. Note that the Concentration y-axis is logarithmically scaled, while the Depth x-axis is linearly scaled. However, whether using a logarithmically or linearly scaled Concentration y-axis, the three exemplary concentration profiles may have a curved shape (e.g., a convex shape), such as a Gaussian curve.

For example, the illustrated dopant concentration profiles $P_1/P_2/P_3$ illustrate an example in which the first region 200A received nitrogen ion dopants during the implantation process and wherein the STI regions 56 had been formed of nitrogen-doped silicon oxide. The dopant concentration profiles $P_1/P_2/P_3$ following the implantation process indicate that the dopant concentration may tend to follow a Gaussian curve through the STI regions 56 (e.g., with a peak in a bulk portion of the STI region 56) and may stop at or near the boundary between the STI regions 56 and the substrate 50. In comparison, the undoped concentration profile $P_0$ may tend to be linear (e.g., flat, as illustrated) through the STI regions 56. As illustrated, the three dopant concentration profiles $P_1/P_2/P_3$ and the undoped concentration profile $P_0$ may exhibit downward slopes through underlying portions of the substrate 50, which may contain smaller amounts (e.g., trace amounts) of one or more of the chemicals used as the dopants. In some embodiments the illustrated dopant concentration profiles $P_1/P_2/P_3$ may apply to a same dopant being used in the implantation process that was originally formed in the STI regions 56 (e.g., nitrogen or silicon). In some embodiments, the illustrated dopant concentration profiles $P_1/P_2/P_3$ may apply to different dopants (e.g., argon or germanium) as may have been used to form the STI regions 56. In addition, the dopant concentration profiles $P_1/P_2/P_3$ may illustrate total concentrations of more than one dopant. In some embodiments, the dopants in the STI regions 56 may reach the peak dopant concentration ranging from $10^{20}$ atoms/cm$^3$ to $10^{21}$ atoms/cm$^3$. Further, the dopants may reach a depth of up to 5 nm into the substrate 50 directly below the STI regions 56.

In accordance with some embodiments, the implantation process may be performed at various points in the fabrication process. For example, the formation of the first implantation mask 120 and the implantation process may be performed after depositing the material of the gate spacers 86 but before patterning to form the gate spacers 86. As a result, the dopants from the implantation process may pass through and implant within the exposed portions of the material of the gate spacers 86 and the dummy dielectric layer 60 along upper surfaces of the first fins 52A.

In some examples, formation of the implantation mask 120 and the implantation process may be performed before patterning the dummy dielectric layer 60. As a result, the dopants from the implantation process may pass through and implant within the exposed portions of the material of the dummy dielectric layer 60 along surfaces of the first fins 52A.

FIGS. 12A through 12D illustrate etching the fins 52 to form source/drain recesses 130 and then subsequently forming epitaxial source/drain regions 82 in the source/drain recesses 130. In some embodiments, after the implantation process, the first implantation mask 120 may be removed by a suitable method. For example, the photoresist may be removed using an acceptable ashing process. After removing the first implantation mask 120, the p-type region 50P may be masked to etch the source/drain recesses 130 and epitaxially grow the epitaxial source/drain regions 82 in the n-type region 50N. Similarly, the n-type region 50N may be masked to etch the source/drain recesses 130 and epitaxially grow the epitaxial source/drain regions 82 in the p-type region 50P. Although, any suitable methods and order of steps may be used. As discussed above, the corresponding figures illustrate features in either of the n-type region 50N and the p-type region 50P, and differences (if any) in the structures or processes of the n-type region 50N and the p-type region 50P may be described in the text accompanying each figure. For example, the source/drain recesses 130 may be formed using one or more etching processes. In some embodiments, the etching process may include any acceptable wet etch or dry etch process, such as a reactive ion etch (RIE), neutral beam etch (NBE), the like, or a combination thereof. The etching process may include anisotropic etching, isotropic etching, or a combination thereof.

In some embodiments, the p-type region 50P may include portions of the first region 200A, the second region 200B, the third region 200C, or combinations thereof. Similarly, the n-type region 50N may include different portions of the first region 200A, the second region 200B, the third region 200C, or combinations thereof. As a result, the etching process in the p-type region 50P may etch some of the first fins 52A that received dopants from the implantation process and some of the second and/or third fins 52B/C that did not receive dopants from the implantation process. Similarly, the etching process in the n-type region 50N may etch others of the first fins 52A that received dopants from the implantation process and others of the second and/or third fins 52B/C that did not receive dopants from the implantation process.

In accordance with some embodiments, the first region 200A may have a first characteristic that affects the etch rate of the first fins 52A, such as having a relatively high pattern density (e.g., the features may be spaced relatively close to each other) between tall features of the structure. In addition, the second region 200B may have a second characteristic that affects the etch rate of the second fins 52B, such as having a relatively low pattern density (e.g., the features may be spaced relatively far apart from each other). Further, as noted above, the third region 200C may have the first characteristic (e.g., a high pattern density) similar to the first region 200A.

In accordance with some embodiments, the first characteristic (e.g., a high pattern density) of the first region 200A and the third region 200C may specifically refer to a relatively small pitch between dummy gate structures. In addition, the second characteristic (e.g., a low pattern density) of the second region 200B may specifically refer to a relatively large pitch between dummy gate structures. For example, pitches of the dummy gate structures in the first region 200A and the third region 200C may be 100 nm or less, and pitches of the dummy gate structures in the second region 200B may be 100 nm or greater. As noted above, the first region 200A and the third region 200C may include portions of the p-type region 50P (e.g., subsequently containing PFETs) and the n-type region 50N (e.g., subsequently containing NFETs). Similarly, the second region 200B may include other portions of the p-type region 50P and the n-type region 50N.

The differences in pitches (e.g., pattern density), such as described above, may factor into the etch rates of the fins 52 when forming the source/drain recesses 130 (see FIGS. 12A through 12D). For example, without performing the implantation process (see FIGS. 11A through 11F), a pattern loading effect would tend to cause material in a low pattern density region (e.g., the second region 200B) to be etched at a faster rate than material in a high pattern density region (e.g., the first region 200A and/or the third region 200C). In particular, the pattern density differences allow the etchant to reach the second fins 52B in the second region 200B more easily than the first fins 52A in the first region 200A and the third fins 52C in the third region 200C.

In accordance with some embodiments, formation of the implantation layer 124 by the implantation process increases the etch rate of the material of the first fins 52A to compensate for the above-described pattern loading effect. In particular, the material of the implantation layer 124 (e.g., the upper portion of the first fins 52A) has a higher etch rate than undoped material of the second fin 52B and the third fin 52C. As a result, etching of the first fins 52A and the second fins 52B (e.g., simultaneously) may form the first and second source/drain recesses 130A/B to a same or similar desired depth at or close to the same time. In addition, etching of the second fins 52B stops before the recesses become too deep, thereby preventing leakage current from epitaxial source/drain regions 82 subsequently formed therein.

The first source/drain recesses 130A in the first region 200A may have a depth $D_1$, and the second source/drain recesses 130B in the second region 200B may have a depth $D_2$, wherein each of the depths $D_1/D_2$ may range from greater than 0 nm to 60 nm. In some embodiments, the depth $D_1$ ranges from 95% to 105% of the depth $D_2$.

In accordance with some embodiments, as discussed above, the third region 200C (e.g., masked during the implantation process) may include the third fins 52C corresponding to dummy gate structures having small pitches similar to the first fins 52A corresponding to the dummy gate structures in the first region 200A. Due to being masked during the implantation process (see FIGS. 11A through 11F), the third fins 52C did not receive the dopants to form the implantation layer 124 and, therefore, experiencing no increase in the etch rate of the material of the third fins 52C. As a result, the third source/drain recesses 130C may have a depth less than the depth $D_1$ and the depth $D_2$, such as the depth $D_3$ ranging from greater than 0 nm to 50 nm (e.g., less than the depths $D_1/D_2$) and/or ranging from 80% to 90% of the depth $D_1$ and/or of the depth $D_2$.

As discussed above, the implantation layer 124 increases the etch rate of the first fin 52A. In some embodiments, the implantation layer 124 may decrease the etch rate of the first fin 52A. The dopants may include boron, boron fluoride (e.g., $BF_2$), or the like. For example, the first region 200A and the third region 200C may each have a lower pattern density (e.g., larger pitches), and the second region 200B may have a higher pattern density (e.g., smaller pitches). For example, pitches of the dummy gate structures in the first and third regions 200A/C may be 100 nm or greater, and pitches of the dummy gate structures in the second region 200B may be 100 nm or less. Similarly as described above, the second and third regions 200B/C may be masked to perform the implantation process on the first region 200A. However, the dopants and parameters used for the implantation process may be selected to form the implantation layer 124 to decrease the etch rate of the material of the first fins 52A as compared to the material of the undoped fins 52B/C. As a result, in the subsequent etching process, the first source/drain recesses 130A may have a same or similar depth as the second source/drain recesses 130B. For example, the second source/drain recesses 130B may have a depth ranging from 95% to 105% of the depth of the first source/drain recesses 130A. In addition, the third source/drain recesses 130C (e.g., located in the third region 200C having a large pitch and being masked during the implantation process) may have a depth greater than the depths of the first and second source/drain recesses 130A/B. As a result, the third epitaxial source/drain regions 82C formed as described below (see FIGS. 13A through 13D) may have a larger size than the first and second epitaxial source/drain regions 82A/B.

In FIGS. 13A through 13D, epitaxial source/drain regions 82 are formed in the source/drain recesses 130 of the fins 52. For example, first, second, and third epitaxial source/drain regions 82A/B/C are formed in the first, second, and third source/drain recesses 130A/B/C of the first, second, and third fins 52A/B/C, respectively. The epitaxial source/drain regions 82 are formed in the fins 52 such that a dummy gate structure (e.g., a dummy gate 72) may be disposed between respective adjacent pairs of the epitaxial source/drain regions 82. The epitaxial source/drain regions 82 extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

As discussed above, the epitaxial source/drain regions 82 in the n-type region 50N may be formed while the p-type region 50P is masked. The epitaxial source/drain regions 82 in the n-type region 50N are epitaxially grown in the source/drain recesses 130. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

As also discussed above, the epitaxial source/drain regions 82 in the p-type region 50P may be formed while the n-type region 50N is masked. The epitaxial source/drain regions 82 in the p-type region 50P are epitaxially grown in the source/drain recesses 130. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

As discussed above, each of the first, second, and third regions 200A/B/C may include portions of the n-type region 50N and the p-type region 50P. As such, the epitaxial source/drain regions 82 in the p-type region 50P may be formed simultaneously in all three regions 200A/B/C, while the n-type region 50N is masked. Similarly, the epitaxial source/drain regions 82 in the n-type region 50N may be formed simultaneously in all three regions 200A/B/C, while the p-type region 50P is masked.

As illustrated, due to being formed in the source/drain recesses 130A/B of similar depths $D_1/D_2$, the first epitaxial source/drain regions 82A may form to a substantially same size as the second epitaxial source/drain regions 82B. In addition, due to being formed in the third source/drain recesses 130C having the shallower depth $D_3$, the third epitaxial source/drain regions 82C may form to a smaller size as compared with the first and second epitaxial source/drain regions 82A/B.

The epitaxial source/drain regions 82 and/or the fins 52 may be implanted with impurities (e.g., n-type or p-type impurities), similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of those impurities previously discussed, and may be different from the dopants used in the implantation process (see FIGS. 11A through 11F). In some embodiments, the epitaxial source/drain regions 82 may be in situ doped during growth.

Figure 13B:
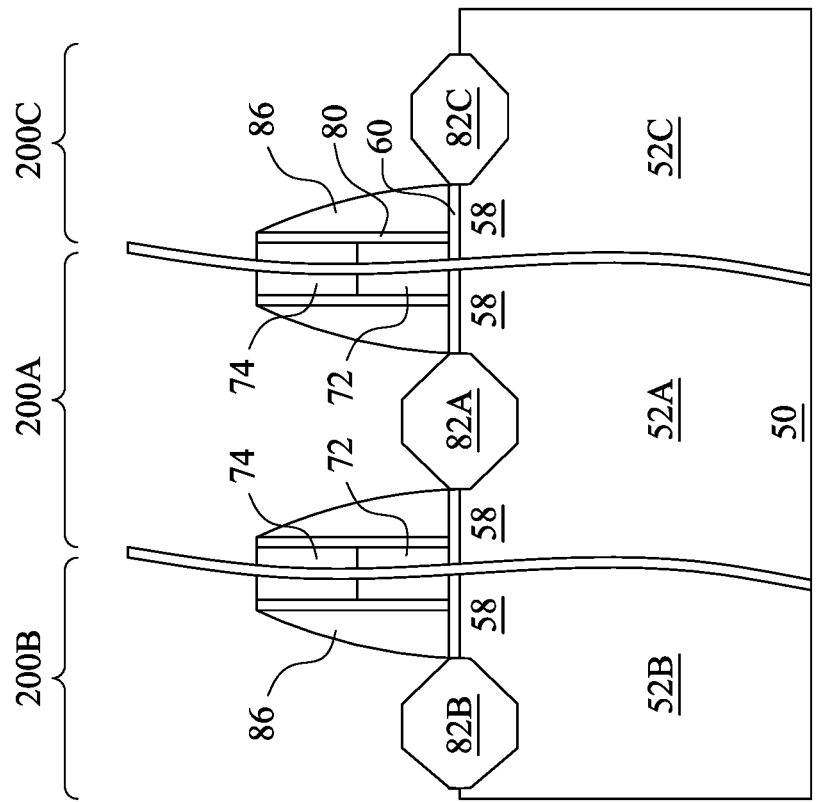
Figure 13A:
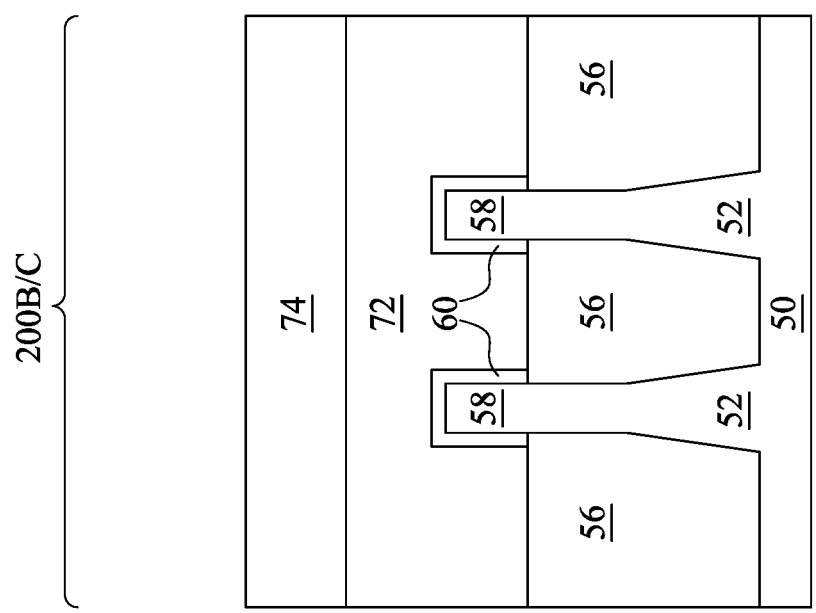
Figure 13C:
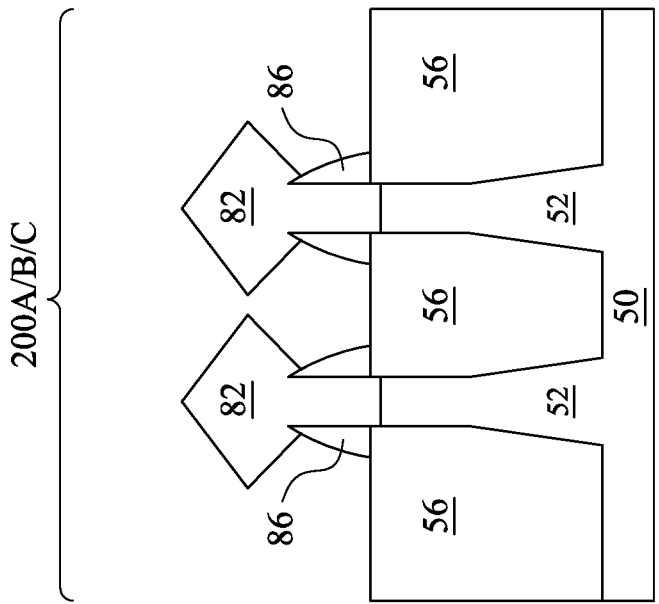
Figure 13D:
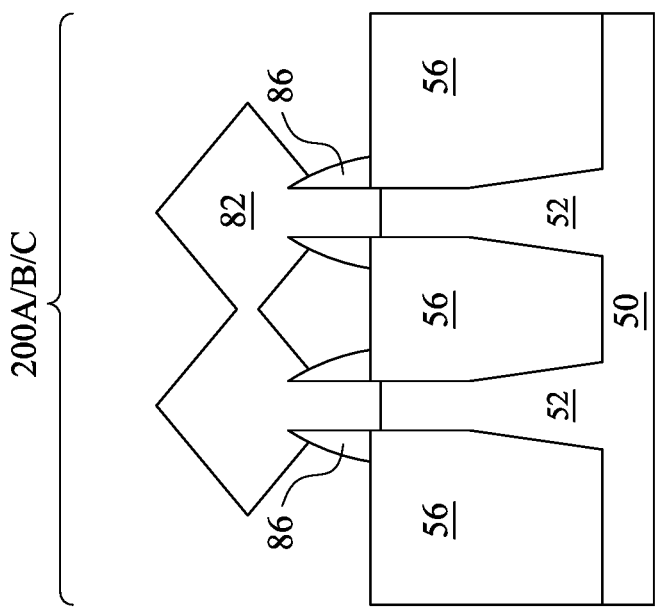

FIGS. 13C and 13D illustrate cross-sectional views of the epitaxial source/drain regions 82 formed over the fins 52 in any or all of the three regions 200A/B/C. For example, either of FIGS. 13C and 13D may correspond to epitaxial source/drain regions 82 having been formed in the first fins 52A that received dopants from the implantation process or in the second and third fins 52B/C that did not receive dopants from the implantation process. As a result of the epitaxy processes used to form the epitaxial source/drain regions 82 in the n-type region 50N and the p-type region 50P, upper surfaces of the epitaxial source/drain regions 82 have facets which expand laterally outward beyond sidewalls of the fins 52. In some embodiments, these facets cause adjacent source/drain regions 82 of a same FinFET to merge as illustrated by FIG. 13C. In some embodiments, adjacent source/drain regions 82 remain separated after the epitaxy process is completed as illustrated by FIG. 13D. In the embodiments illustrated, gate spacers 86 are formed covering a portion of the sidewalls of the fins 52 that extend above the STI regions 56 thereby blocking the epitaxial growth. In some embodiments, the spacer etch used to form the gate spacers 86 may be adjusted to remove the spacer material to allow the epitaxially grown region to extend to the surface of the STI region 56.

The process described with respect to FIGS. 9A through 13D is just one example of how the epitaxial source/drain regions 82 may be formed. In some embodiments (not illustrated), a second implantation process similar to the above-described implantation process may be performed on, for example, a fourth region. For example, after forming the first implantation mask 120 and performing a first implantation process, the first implantation mask 120 may be removed, a second implantation mask may be formed over a fifth region, and the second implantation process may be performed on the exposed fourth region. Note that the exposed fourth region (e.g., receiving the second implantation process) may be distinct from the first region 200A (e.g., receiving the first implantation process). Alternatively, the fourth region may overlap with a portion or an entirety of the first region 200A. Consequently, some or all of the fins 52 may receive different implantations as compared to others of the fins 52. In addition or alternatively, some of the fins 52 may receive multiple implantations, while others of the fins 52 may receive only one implantation or no implantations. The above-described steps may be repeated for any number of implantation processes, whether using the same, similar, or varying parameters and dopants for each implantation process. For example, any of the dopants, implantation energy, dosage concentration, and implantation angles may be differ between the first implantation process and any subsequent implantation processes.

In some embodiments with multiple implantations, during the second implantation, the exposed fourth region may include a portion or all of the first region 200A and/or a portion or all of the second region 200B. The second implantation process may then be performed on the exposed fins 52 in the fourth region with same or similar dopants and process parameters as the first implantation process. For example, the second implantation process may be designed to provide a lower doping level than the first implantation process. As a result, some of the fins 52 may receive both implantations (e.g., a first highest dopant concentration), some of the fins 52 may receive only the first implantation (e.g., a second highest dopant concentration), some of the fins 52 may receive only the second implantation (e.g., a third highest dopant concentration), and some of the fins 52 may receive neither of the implantations. Alternatively, the first implantation process and the second implantation process may use different dopants and/or process parameters in order to provide a larger variety of modifications to the material properties of the three groupings of the fins 52 receiving one or both of the implantations.

In some embodiments with multiple implantations, the first implantation process may increase the etch rates of the material of the first fins 52A, while the second implantation process may decrease the etch rates of the material of the fins 52 in the fourth region. Note that in this embodiment, there may be no overlap between the first region 200A and the fourth region and, therefore, no fins 52 receiving both the first and the second implants. Alternatively, the first implantation process may decrease the etch rates of the material of the first fins 52A, while the second implantation process may increase the etch rates of the material of the fins 52 in the fourth region.

Further, in some embodiments with multiple implantations, the second implantation process may be performed without first removing the first implantation mask 120 after the first implantation process. In some such embodiments, the second implantation mask may be formed over the first implantation mask 120 and patterned to expose a portion of the first region 200A. Note that the second implantation mask may be formed similarly as described above in connection with the first implantation mask 120 or by any suitable method. As a result, some of the first fins 52A would receive both implantations, others of the first fins 52A would receive only the first implantation, and the second and third fins 52B/C would receive no implantations. The second implantation process may be performed using same or different process parameters and dopants as the first implantation process, as described above.

Note that other combinations of the process parameters and dopants described in connection with one or more implantation processes may be utilized and are intended to be within the scope of this disclosure. In addition, the one or more implantation processes and formation of the epitaxial source/drain regions 82 may be performed in the p-type region 50P while an entirety of the n-type region 50N is masked. Similarly, one or more other implantation processes and formation of the epitaxial source/drain regions 82 may be performed in the n-type region 50N while an entirety of the p-type region 50P is masked.

FIGS. 14A through 19B illustrate subsequent steps in the fabrication of the semiconductor device. Note that each figure may illustrate features in any of the three regions 200A/B/C, unless otherwise stated.

Figure 14B:
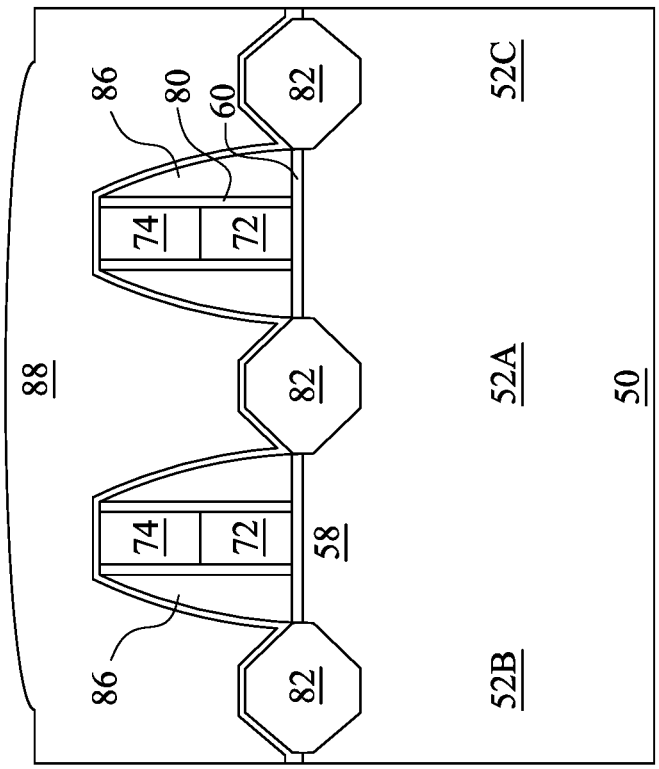
Figure 14A:
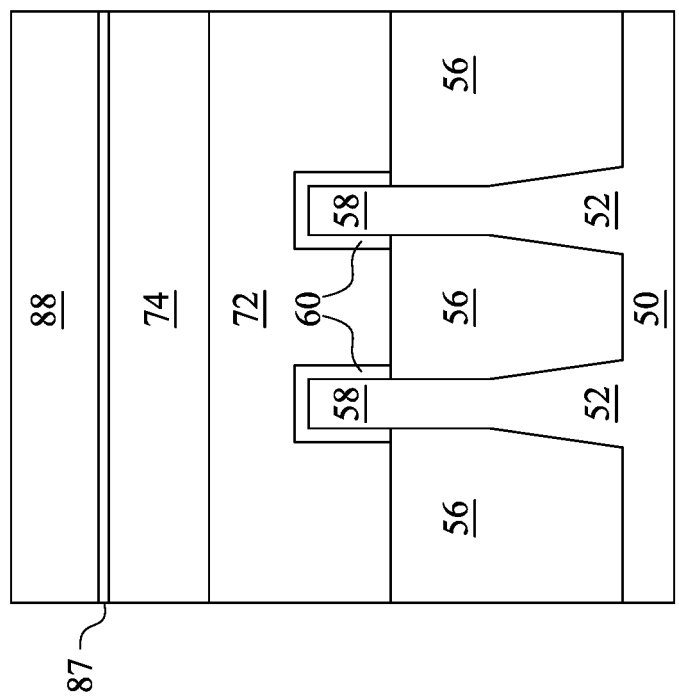

In FIGS. 14A and 14B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 15B:
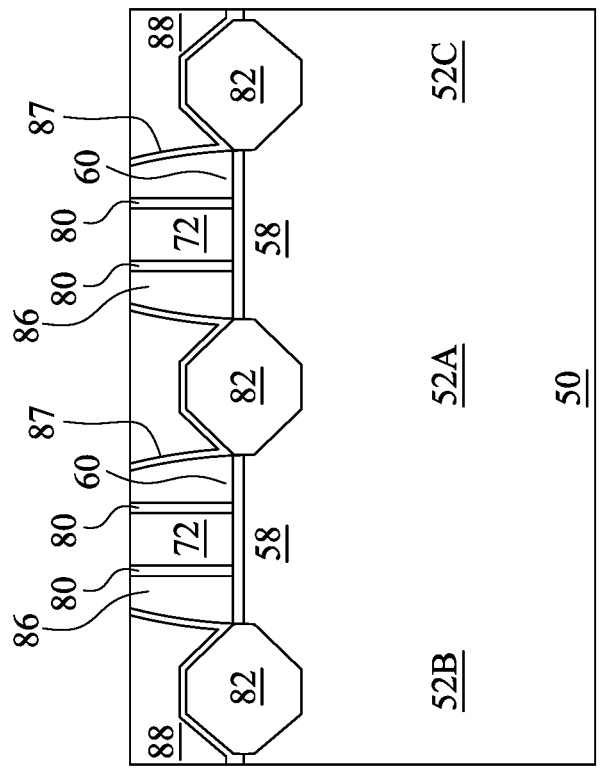
Figure 15A:
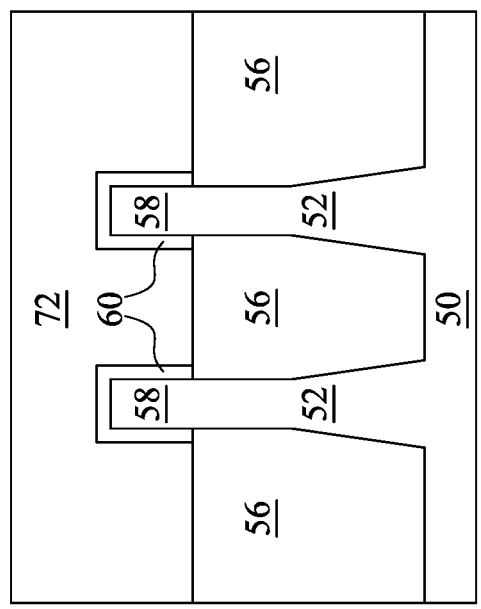

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 16B:
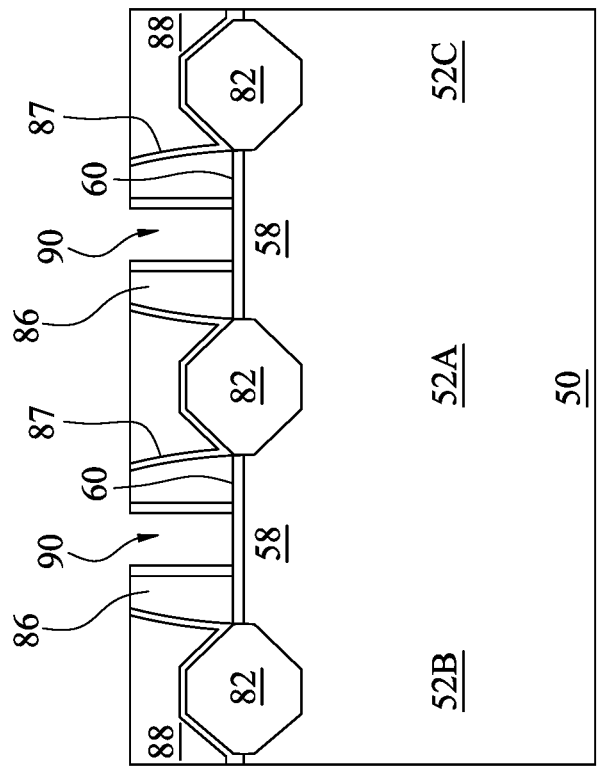
Figure 16A:
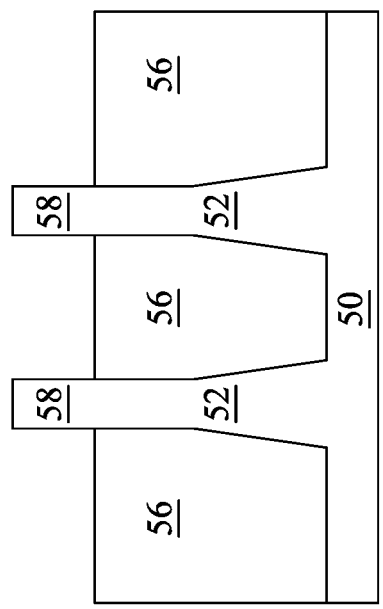

In FIGS. 16A and 16B, the dummy gates 72, and the masks 74 if present, are removed in one or more etching steps, so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17A:
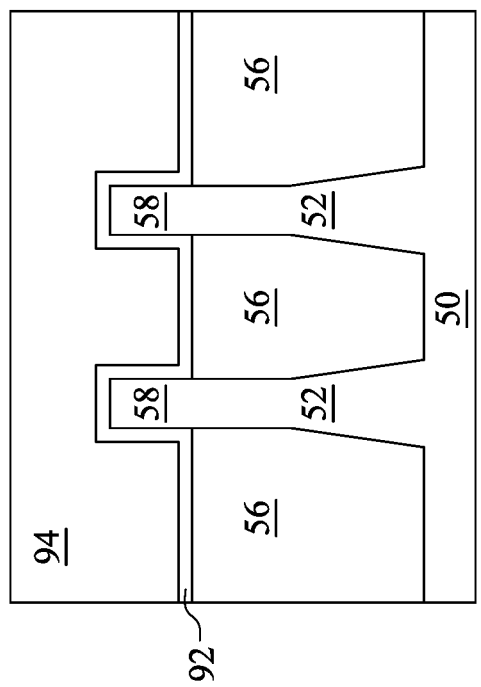
Figure 17B:
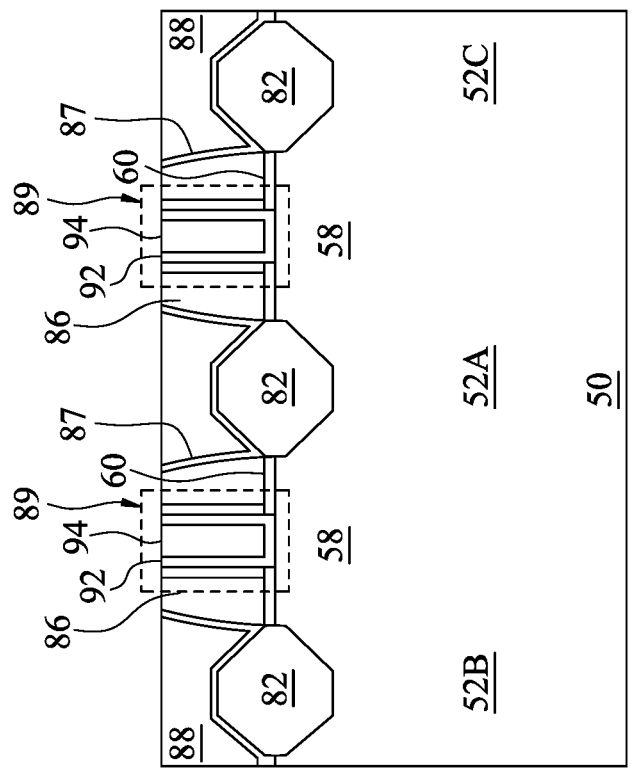
Figure 17C:
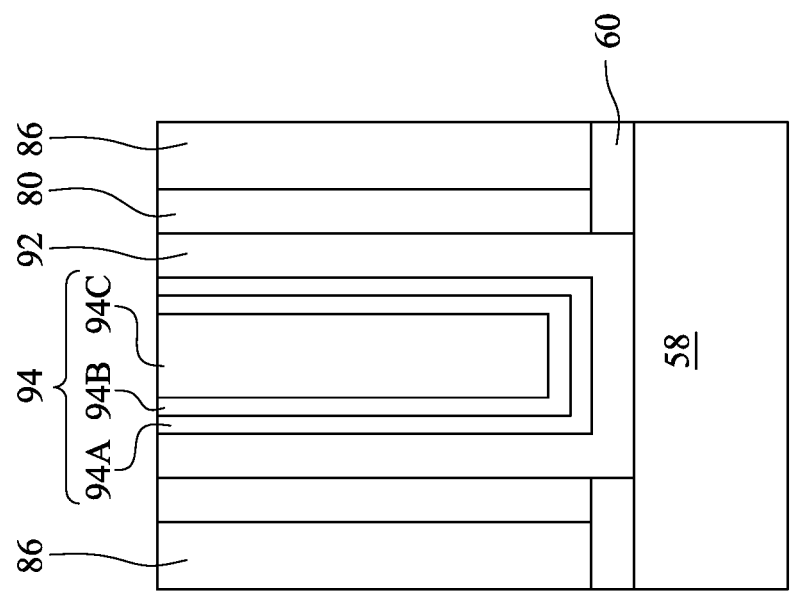

In FIGS. 17A and 17B, gate dielectric layers 92 and gate electrodes 94 are formed for replacement gates. FIG. 17C illustrates a detailed view of region 89 of FIG. 17B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
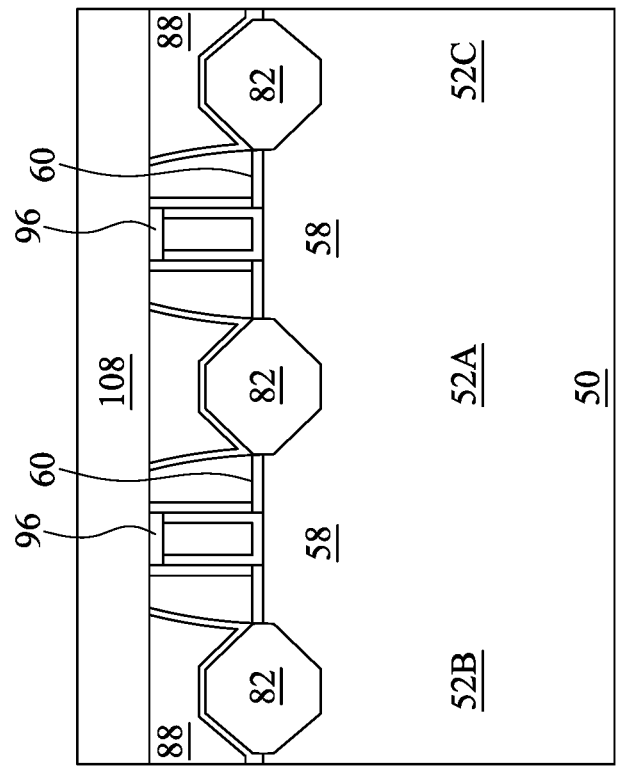
Figure 18A:
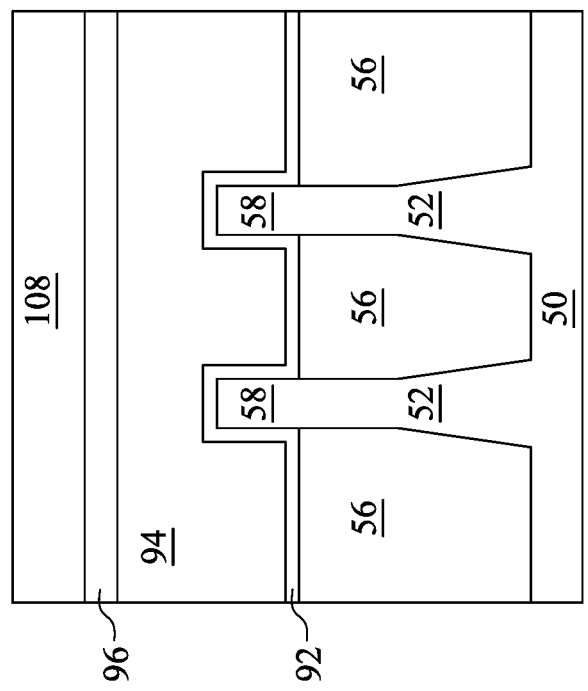

In FIGS. 18A and 18B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. The gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 19A and 19B) penetrate through the second ILD 108 and the gate mask 96 (if present) to contact the top surface of the recessed gate electrode 94.

Figure 19B:
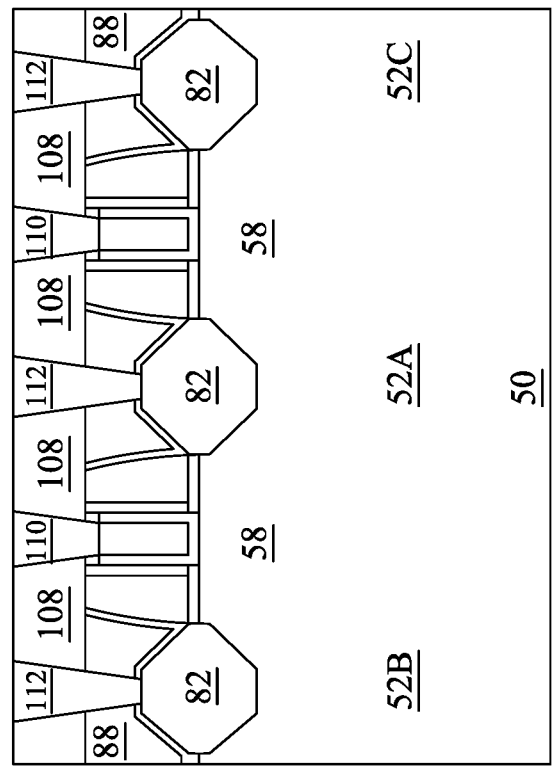
Figure 19A:
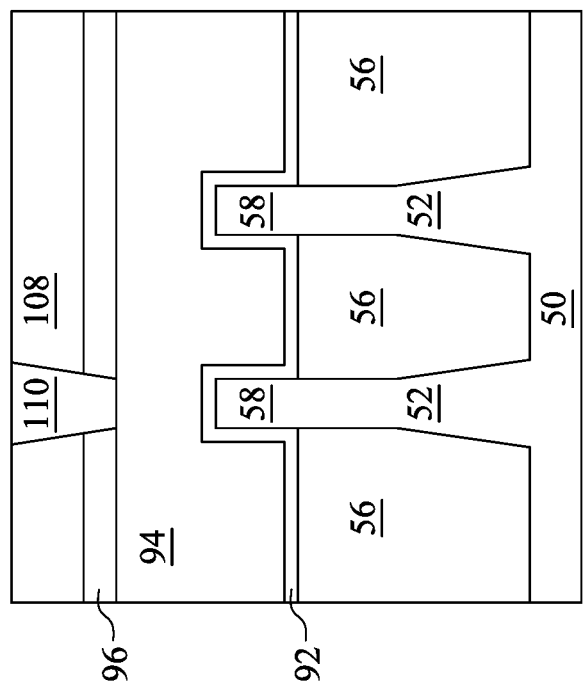

In FIGS. 19A and 19B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

In FIGS. 20A through 20E, in accordance with various embodiments, the implantation processes described above may be performed with greater specificity with respect to additional process parameters. In particular, each implantation process may include one or more anisotropic implantation sub-steps designed to effectively implant dopants into the fins 52 to compensate for or navigate a variety of geometries of the structure in those particular regions. For example, a tilt angle θ and a twist angle Φ, together, specify an incident angle of an implantation beam 300 of each implantation sub-step. In addition, a wafer rotation protocol may be selected to rotate the wafer between implantation sub-steps and to reach additional features of the structure during the implantation process. Note that the illustrated implantation beam 300 may represent a plurality of implantation beams 300 having the same incident angle during each implantation sub-step. In addition, the implantation beams 300 illustrated in FIGS. 20C and 20E as having multiple incident angles may indicate multiple implantation sub-steps with a wafer rotation therebetween of, for example, 90° or 180°. Further, the tilt angle θ, the twist angle Φ, and the rotation protocol are illustrated and described herein in relation to a y-z plane being parallel with the illustrated dummy gates 72, an x-z plane being parallel with the illustrated fins 52A (e.g., the first fins 52A), and an x-y plane being parallel with a major surface of the wafer. However, any suitable combination of orientations may be used.

The tilt angle θ refers to an angle of the implantation beam relative to the z-axis. In some embodiments, the tilt angle θ being greater than 0° may be used to implant the dopants into sidewalls of the illustrated fins 52, so long as the twist angle Φ (discussed in greater detail below) is less than 90°. In some embodiments, the tilt angle θ may range from 0° (e.g., vertical or parallel with the z-axis) to 60°. The tilt angle θ being less than or equal to 60° allows the implantation beam 300 to reach the fins 52 with minimal inhibition from adjacent taller features (e.g., the dummy gates 72). In embodiments wherein the implantation process is performed in a region having small pitches and/or large heights of the adjacent taller features, the tilt angle θ may be 30° or less. The implantation may include two implantation beams 300 such that the tilt angle θ of one implantation beam is a mirror of the tilt angle θ of the other implantation beam.

The twist angle Φ refers to an angle of the implantation beam relative to the y-z plane. In some embodiments, the twist angle Φ being greater than 0° may be used to implant the dopants into sidewalls of the illustrated dummy gate structures, such as for the purpose of implanting the dopants into portions of the illustrated fins 52 under the dummy gate structures. The twist angle Φ may range from 0° (e.g., parallel with the y-z plane) to 90° (e.g., parallel with the x-z plane). In some embodiments, the implantation beams 300 may include multiple beams 300 of different incident angles, such as with two implantation beams 300. As such, the twist angle Φ of each implantation beam 300 may be a mirror rotation toward the positive x-axis (as illustrated) or toward the negative x-axis (not illustrated). Similarly as with the tilt angle θ, the twist angle Φ may be chosen based on the pattern geometries of the region to be implanted (e.g., adjacent taller features, such as the dummy gate structures).

The rotation protocol may include rotating the wafer for multiple implantation sub-steps. For example, the implantation process may include one implantation sub-step. In some embodiments, the implantation process may include two implantation sub-steps with a wafer rotation of, for example, 180° therebetween. In some embodiments, the implantation process may include four implantation sub-steps with a wafer rotation of, for example, 90°, between each.

Figure 20B:
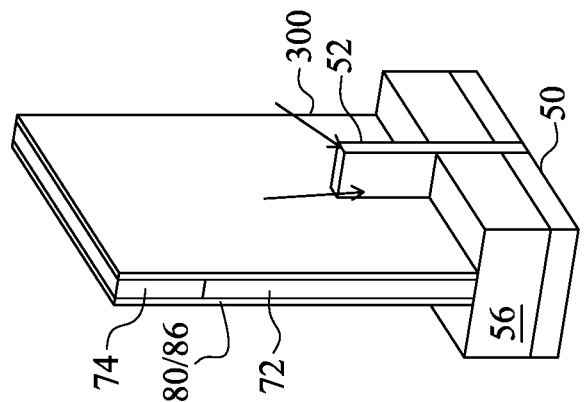
FIGS. 20A, 20B, 20C, 20D, and 20E illustrate examples of an intermediate stage in a three-dimensional view, in accordance with some embodiments.

FIG. 20B illustrates an example implantation process in an embodiment in which the first region 200A has very small pitches and/or very large heights of the adjacent taller features (e.g., very tall dummy gate structures as compared with the fins 52). For example, as illustrated in FIG. 20B the tilt angle θ may be less than 30°, such as about 0°, to ensure that the implantation beam 300 reaches the fins 52 without inhibition from the dummy gate structures. As a result, the dopants may implant at greater amounts into upper surfaces of the fins 52 and to lesser amounts (e.g., substantially zero amounts) into sidewall surfaces of the fins 52. In addition, the dopants may implant at lesser amounts (e.g., substantially zero amounts) into portions of the fins 52 directly below the dummy gate structures. Consequently, upper portions of the fins 52 with higher concentrations of the dopants may have a higher etch rate than lower portions of the fins 52 (and portions directly below the dummy gate structures) with lower concentrations of the dopants. Note that in embodiments in which the tilt angle is about 0°, any twist angle Φ would have little to no effect on the incident angle of the implantation beam 300 on the fins 52. Similarly, a rotation protocol of more than one implantation sub-step would also have little to no effect on the implant regions on the fins 52 in a subsequent implantation sub-step.

Figure 20C:
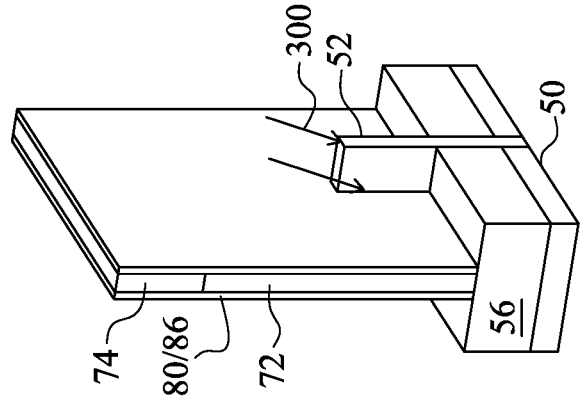
Figure 20A:
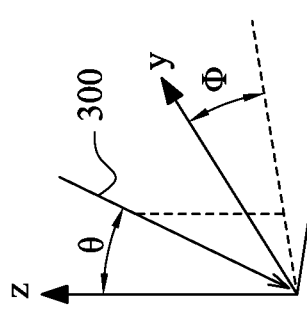

FIG. 20C illustrates an example implantation process in an embodiment in which the first region 200A has small pitches and/or large heights of the adjacent taller features. For example, the tilt angle θ may be 30° and the twist angle Φ may be 0°. In addition, the rotation protocol may include rotating the wafer by 180° between two implantation sub-steps. As a result, the dopants may implant into both upper surfaces and sidewalls of the fins 52 at greater amounts as compared to portions of the fins 52 directly below the dummy gate structures. Consequently, etch rates of the material of the upper and lower portions of the fins 52 may increase by similar amounts as compared to an undoped fin 52. Alternatively, the rotation protocol may include rotating the wafer by 90° between four implantation sub-steps. As a result, the dopants may also implant into the portions of the fins 52 directly below the dummy gate structures, thereby increasing the etch rates of those portions.

Figure 20D:
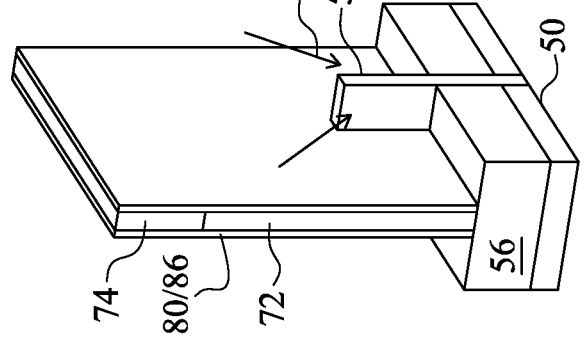

FIG. 20D illustrates an example implantation of the dopants into portions of the fins 52 directly below the dummy gate structures. The subsequent formation of the first source/drain recesses 130A may include etching of the first fins 52A partially below the dummy gate structures due to the increased concentration of the dopants in those portions of the first fins 52A. As a result, the subsequently formed first epitaxial source/drain regions 82A may extend partially below the dummy gate structures. For example, the tilt angle θ may be greater than 0°, such as ranging from 30° to 60°, and the twist angle Φ may be greater than or equal to 60°, such as 90°. For example, the rotation protocol may include rotating the wafer by 180° between two implantation sub-steps in order for the dopants to reach the fins 52 on an opposing side of the dummy gate structures. In addition, the rotation protocol may include rotating the wafer by 90° between four implantation sub-steps in order for the dopants to reach the fins 52 on an opposing side of the gate structures as well as opposing sidewalls of the fins 52. As a result, the dopants may implant at greater amounts into upper surfaces of the fins 52 (and portions of the fins 52 directly below the dummy gate structures) and at lesser amounts into sidewall surfaces of the fins 52. Consequently, the material of the upper portions of the fins 52 (e.g., with a higher concentration of the dopants) may have a higher etch rate than the material of the lower portions of the fins 52 (e.g., with a lower concentration of the dopants).

Figure 20E:
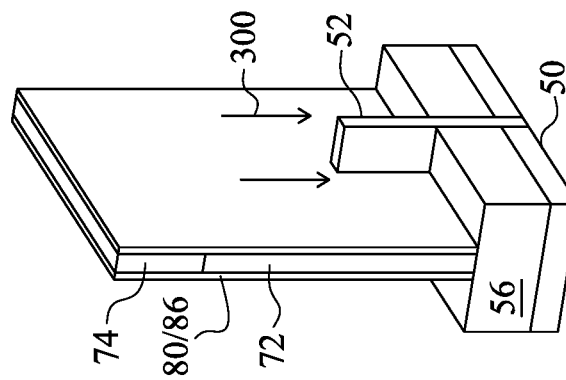

FIG. 20E illustrates an example implantation process that may provide a relatively consistent implantation of the dopants into upper and lower portions of the fins 52 as well as implantation into portions of the fins 52 directly below the dummy gate structures. For example, the tilt angle θ may range from 30° to 60°, and the twist angle Φ may range from 30° to 60°, such as about 45°. The rotation protocol may include rotating the wafer by 90° between four implantation sub-steps in order for the dopants to reach the fins 52 on an opposing side of the dummy gate structures as well as opposing sides of the fins 52 themselves. As a result of the dopants implanting into upper surfaces and sidewall surfaces of the fins 52, etch rates of the material of the upper and lower portions of the fins 52 may increase by similar amounts with one another, for example, as compared to an undoped fin 52. Similarly, etch rates of the portions of the fins 52 directly below the dummy gate structures may increase as compared to an undoped fin 52.

Note that FIGS. 20B through 20E provide examples of implantation processes in certain embodiments in which the dopants would increase the etch rates of the materials they are implanted into. However, these examples are not intended to be limiting. For example, in embodiments in which the dopants would decrease the etch rates of the fins 52, different combinations of the above-described specifications may be selected.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks (e.g., analogous to the dummy dielectric layer 60, the dummy gate 72, and the mask 74) and source/drain regions are formed in a manner similar to the above-described embodiments. For example, the implantation process may be used to adjust etch rates of certain fins before forming source/drain recesses and growing epitaxial source/drain regions therein. After the dummy gate stacks are removed, the sacrificial layers can be partially or fully removed in channel regions. The replacement gate stacks (e.g., analogous to the gate dielectric layer 92 and the gate electrode) are formed in a manner similar to the above-described embodiments, the replacement gate stacks may partially or completely fill openings left by removing the sacrificial layers, and the replacement gate stacks may partially or completely surround the channel layers in the channel regions of the NSFET devices. ILDs and contacts to the replacement gate stacks and the source/drain regions may be formed in a manner similar to the above-described embodiments. A nanostructure device can be formed as disclosed in U.S. Pat. No. 9,647,071, which is incorporated herein by reference in its entirety.

Advantages may be achieved. The disclosed embodiments provide improved control, reliability, and consistency to the formation of the epitaxial source/drain regions 82, for example, through improvements to the formation of the source/drain recesses 130. In particular, differences in the geometry of the structure between the first region 200A and the second region 200B may cause differences in the etch rates of those regions. However, the above-described modifications to the material properties of, for example, the first region may be used to modify the etch rate of the first region to compensate for those differences. For example, in embodiments in which the first region may have a smaller pitch of dummy gate structures than in the second region, etching the first fins 52A to form the first source/drain recesses 130A in the first region 200A may be slower than etching the second fins 52B to form the second source/drain recesses 130B in the second region 200B. However, performing an implantation process to implant certain dopants into the first region 200A (before formation of the source/drain recesses 130) may increase the etch rate of that material so that formation of the first and second source/drain recesses 130A/B may be performed simultaneously and to the same specifications (e.g., same depths). In addition, to the extent certain variations in the specifications or dimensions of the source/drain recesses 130 may be desired, one or more implantation processes may be performed to achieve those particular specifications. As a result of the disclosed methods, the resulting epitaxial source/drain regions 82 may be formed with an increased efficiency and consistency to the desired specifications. The resulting semiconductor device may be fabricated with increased yield and reliability.

In an embodiment, a method of forming a semiconductor device includes forming a first dummy gate structure over a first region of a substrate and a second dummy gate structure over a second region of the substrate, the first region and the second region of the substrate having a first composition, the first composition having a first etch rate; implanting the first region of the substrate with dopants laterally adjacent to the first dummy gate structure, wherein after the implanting the first region, the first region has a second composition having a second etch rate, the second etch rate being different from the first etch rate; etching a first recess in the first region of the substrate having the second composition and a second recess in the second region having the first composition; and epitaxially growing a first source/drain region in the first recess and a second source/drain region in the second recess.

In another embodiment, the first dummy gate structure is at a smaller pitch than the second dummy gate structure. In another embodiment, the second etch rate is greater than the first etch rate. In another embodiment, the method further includes before implanting the first region of the substrate, masking the second region of the substrate; and after implanting the first region of the substrate, unmasking the second region of the substrate. In another embodiment, the etching the first recess and the second recess comprises using same etchants to etch the first recess and the second recess. In another embodiment, the method further includes, after forming the first dummy gate structure and the second dummy gate structure, lightly doping the first region and the second region with first impurities. In another embodiment, the dopants are different from the first impurities. In another embodiment, the method further includes doping the first source/drain region and the second source/drain region with second impurities, wherein the second impurities are different from the dopants.

In an embodiment, a method of forming a semiconductor device includes forming a first gate structure over a first semiconductor region and a first isolation region adjacent the first semiconductor region; forming a second gate structure over a second semiconductor region and a second isolation region adjacent the second semiconductor region; forming a patterned mask layer having an opening, wherein the opening exposes exposed portions of the first semiconductor region, the first gate structure, and the first isolation region, wherein the second semiconductor region adjacent the second gate structure, the second gate structure, and the second isolation region remain covered by the patterned mask layer; implanting a dopant into the exposed portions of the first semiconductor region, the first gate structure, and the first isolation region, wherein the exposed portion of the first isolation region has a first concentration profile of the dopant extending from an upper surface of the first isolation region to the semiconductor substrate, wherein the first concentration profile has a convex shape; removing the patterned mask layer; etching the exposed portion of the first semiconductor region to form a first recess in the first semiconductor region and a second recess in the second semiconductor region; and forming a first source/drain region in the first recess and a second source/drain region in the second recess. In another embodiment, the first concentration profile has a peak in a bulk portion of the first isolation region. In another embodiment, after forming the first source/drain region and the second source/drain region, the second isolation region is free of the dopant. In another embodiment, the first gate structure has a first pitch with a first adjacent gate structure, wherein the second gate structure has a second pitch with a second adjacent gate structure, and wherein the second pitch is greater than the first pitch. In another embodiment, the dopant comprises at least one of argon and germanium. In another embodiment, before implanting the dopant, the second isolation region comprises the dopant and has a second concentration profile of the dopant extending from an upper surface of the second isolation region to the semiconductor substrate, and wherein the second concentration profile is flat. In another embodiment, the dopant comprises at least one of nitrogen and silicon.

In an embodiment, a semiconductor device includes a first region comprising: first gate electrodes having a first pitch; and a first epitaxial region disposed within a substrate and between the first gate electrodes, the first epitaxial region having a first depth below a top surface of the substrate; and a second region comprising: second gate electrodes having a second pitch greater than the first pitch; and a second epitaxial region disposed within the substrate and between the second gate electrodes, the second epitaxial region having a second depth below the top surface of the substrate, the first depth being between 95% and 105% of the second depth. In another embodiment, the first region further comprises a first isolation region comprising silicon oxide and a dopant, wherein the second region further comprises a second isolation region comprising silicon oxide free of the dopant. In another embodiment, the semiconductor device further includes a third region, the third region comprising: third gate electrodes having the first pitch; and a third epitaxial region disposed within the substrate and between the third gate electrodes, the third epitaxial region having a third depth below the top surface of the substrate, the third depth being less than the first depth. In another embodiment, the third region further comprises a third isolation region, the third isolation region being free of the dopant. In another embodiment, a first concentration profile of the dopant in the first isolation region is curved, wherein a second concentration profile of the dopant in the second isolation region is flat.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first dummy gate structure over a first region of a substrate and a second dummy gate structure over a second region of the substrate, the first region and the second region of the substrate having a first composition, the first composition having a first etch rate;
    implanting the first region of the substrate with dopants laterally adjacent to the first dummy gate structure, wherein after the implanting the first region, the first region has a second composition having a second etch rate, the second etch rate being different from the first etch rate;
    etching a first recess in the first region of the substrate having the second composition and a second recess in the second region having the first composition; and
    epitaxially growing a first source/drain region in the first recess and a second source/drain region in the second recess.

2. The method of claim 1, wherein the first dummy gate structure is at a smaller pitch than the second dummy gate structure.

3. The method of claim 1, wherein the second etch rate is greater than the first etch rate.

4. The method of claim 1 further comprising:
    before implanting the first region of the substrate, masking the second region of the substrate; and
    after implanting the first region of the substrate, unmasking the second region of the substrate.

5. The method of claim 1, wherein the etching the first recess and the second recess comprises using same etchants to etch the first recess and the second recess.

6. The method of claim 1 further comprising, after forming the first dummy gate structure and the second dummy gate structure, lightly doping the first region and the second region with first impurities.

7. The method of claim 6, wherein the dopants are different from the first impurities.

8. The method of claim 7 further comprising doping the first source/drain region and the second source/drain region with second impurities, wherein the second impurities are different from the dopants.

9. A method of forming a semiconductor device, the method comprising:
  forming a first gate structure over a first semiconductor region and a first isolation region adjacent the first semiconductor region;
  forming a second gate structure over a second semiconductor region and a second isolation region adjacent the second semiconductor region;
  forming a patterned mask layer having an opening, wherein the opening exposes exposed portions of the first semiconductor region, the first gate structure, and the first isolation region, wherein the second semiconductor region adjacent the second gate structure, the second gate structure, and the second isolation region remain covered by the patterned mask layer;
  implanting a dopant into the exposed portions of the first semiconductor region, the first gate structure, and the first isolation region, wherein the exposed portion of the first isolation region has a first concentration profile of the dopant extending from an upper surface of the first isolation region to a semiconductor substrate, wherein the first concentration profile has a convex shape;
  removing the patterned mask layer;
  etching the exposed portion of the first semiconductor region to form a first recess in the first semiconductor region and a second recess in the second semiconductor region; and
  forming a first source/drain region in the first recess and a second source/drain region in the second recess.

10. The method of claim 9, wherein the first concentration profile has a peak in a bulk portion of the first isolation region.

11. The method of claim 9, wherein after forming the first source/drain region and the second source/drain region, the second isolation region is free of the dopant.

12. The method of claim 11, wherein the first gate structure has a first pitch with a first adjacent gate structure, wherein the second gate structure has a second pitch with a second adjacent gate structure, and wherein the second pitch is greater than the first pitch.

13. The method of claim 11, wherein the dopant comprises at least one of argon and germanium.

14. The method of claim 9, wherein before implanting the dopant, the second isolation region comprises the dopant and has a second concentration profile of the dopant extending from an upper surface of the second isolation region to the semiconductor substrate, and wherein the second concentration profile is flat.

15. The method of claim 14, wherein the dopant comprises at least one of nitrogen and silicon.

16. A method of forming a semiconductor device, the method comprising:
  forming a first gate structure and a second gate structure over a semiconductor fin;
  forming a mask over the first gate structure and a first region of the semiconductor fin adjacent to the first gate structure;
  performing an implantation of a first dopant into a second region of the semiconductor fin adjacent to the second gate structure, the first dopant comprising at least one of nitrogen, argon, silicon, or germanium;
  removing the mask from the first gate structure; and
  etching the first region and the second region with an etchant for a same duration, wherein after etching the first region and the second region:
    the first region comprises a first recess having a first depth; and
    the second region comprises a second recess having a second depth, the second depth being greater than the first depth.

17. The method of claim 16, wherein the implantation comprises a plasma implantation process.

18. The method of claim 16, further comprising:
  forming a first source/drain region in the first recess; and
  forming a second source/drain region in the second recess.

19. The method of claim 18, further comprising doping the first source/drain region and the second source/drain region with a second dopant, wherein the second dopant is a different material than the first dopant.

20. The method of claim 19, wherein during the etching the first region and the second region, the first region is free of the dopant.

* * * * *